United States Patent
Labanowski et al.

(10) Patent No.: US 12,366,618 B2
(45) Date of Patent: Jul. 22, 2025

(54) SYSTEM FOR AN ACOUSTICALLY DRIVEN FERROMAGNETIC RESONANCE SENSOR DEVICE

(71) Applicant: Sonera, Inc., Berkeley, CA (US)

(72) Inventors: Dominic Labanowski, Berkeley, CA (US); Sayeef Salahuddin, Walnut Creek, CA (US)

(73) Assignee: Sonera, Inc., Berkeley, CA (US)

( * ) Notice: Subject to any disclaimer, the term of this patent is extended or adjusted under 35 U.S.C. 154(b) by 0 days.

(21) Appl. No.: 18/222,543

(22) Filed: Jul. 17, 2023

(65) Prior Publication Data
US 2024/0151667 A1    May 9, 2024

Related U.S. Application Data

(63) Continuation of application No. 17/120,907, filed on Dec. 14, 2020, now Pat. No. 11,740,192.

(60) Provisional application No. 62/948,146, filed on Dec. 13, 2019.

(51) Int. Cl.
| | |
|---|---|
| *G01R 33/24* | (2006.01) |
| *G01N 24/10* | (2006.01) |
| *G01R 33/00* | (2006.01) |
| *G01R 33/02* | (2006.01) |

(Continued)

(52) U.S. Cl.
CPC ......... *G01R 33/24* (2013.01); *G01R 33/0017* (2013.01); *G01R 33/02* (2013.01); *G01R 33/18* (2013.01); *G01R 33/60* (2013.01); *G01N 24/10* (2013.01)

(58) Field of Classification Search
CPC ........ G01N 24/10; G01R 33/02; G01R 33/18; G01R 33/24; H01P 5/16
See application file for complete search history.

(56) References Cited

U.S. PATENT DOCUMENTS

| 4,078,186 A | 3/1978 | Folen et al. |
|---|---|---|
| 4,951,674 A | 8/1990 | Zanakis et al. |
| 6,046,657 A | 4/2000 | Alers et al. |

(Continued)

FOREIGN PATENT DOCUMENTS

| CN | 101064014 A | 10/2007 |
|---|---|---|
| CN | 102918389 A | 2/2013 |

(Continued)

OTHER PUBLICATIONS

Bas et al.; All-optical probing of GHz acoustic waves in multiferroic MEMS; InMOEMS and Miniaturized Systems XVII; SPIE; vol. 10545; pp. 18-25; Feb. 22, 2018.

(Continued)

*Primary Examiner* — Judy Nguyen
*Assistant Examiner* — James Split
(74) *Attorney, Agent, or Firm* — Shay Glenn LLP

(57) ABSTRACT

A system for an acoustically driven ferromagnetic resonance (ADFMR) based sensor. The system may include a power source, that provides an electrical signal to power the system, at least one circuit comprising a set of ADFMR circuits, sensitive to external electromagnetic fields, a power splitter, a power combiner and a detector circuit. The system functions to detect and measure external electromagnetic (EM) fields by measuring a perturbation of the electrical signal through the ADFMR circuits due to the EM fields.

18 Claims, 38 Drawing Sheets

(51) Int. Cl.
   *G01R 33/18* (2006.01)
   *G01R 33/60* (2006.01)

(56) References Cited

U.S. PATENT DOCUMENTS

| | | |
|---|---|---|
| 6,279,406 B1 | 8/2001 | Li et al. |
| 6,590,751 B1 | 7/2003 | Horng et al. |
| 7,053,730 B2 | 5/2006 | Park et al. |
| 7,560,920 B1 | 7/2009 | Ouyang et al. |
| 7,696,748 B2 | 4/2010 | Schlicker et al. |
| 9,099,984 B2 | 8/2015 | Reinhardt et al. |
| 10,601,400 B1 | 3/2020 | McConney et al. |
| 11,740,192 B2 | 8/2023 | Labanowski et al. |
| 11,762,045 B2 | 9/2023 | Labanowski et al. |
| 11,903,715 B1 | 2/2024 | Deka et al. |
| 2007/0167723 A1 | 7/2007 | Park et al. |
| 2007/0252593 A1 | 11/2007 | Takeuchi et al. |
| 2009/0066318 A1 | 3/2009 | Kahlman et al. |
| 2009/0212769 A1 | 8/2009 | Stoica et al. |
| 2010/0039105 A1 | 2/2010 | Ryan et al. |
| 2010/0164487 A1 | 7/2010 | Eyckmans et al. |
| 2010/0253326 A1 | 10/2010 | Koyilothu et al. |
| 2012/0218060 A1 | 8/2012 | Burk et al. |
| 2012/0256522 A1 | 10/2012 | Ito et al. |
| 2012/0280682 A1* | 11/2012 | Cheng .................... G01N 29/30 324/301 |
| 2013/0165766 A1 | 6/2013 | Nishikawa et al. |
| 2013/0271145 A1 | 10/2013 | Hwang et al. |
| 2013/0324832 A1 | 12/2013 | Wu et al. |
| 2014/0139213 A1 | 5/2014 | Cadugan et al. |
| 2015/0318838 A1 | 11/2015 | Bhattacharjee et al. |
| 2016/0143541 A1 | 5/2016 | He et al. |
| 2017/0086681 A1 | 3/2017 | Passmore |
| 2017/0363584 A1 | 12/2017 | Tong et al. |
| 2018/0081001 A1 | 3/2018 | Iwasaki et al. |
| 2018/0292468 A1 | 10/2018 | Guo |
| 2019/0317161 A1 | 10/2019 | Quandt |
| 2019/0325904 A1 | 10/2019 | Ramakrishnan |
| 2019/0385586 A1* | 12/2019 | Salahuddin ............ G01R 33/18 |
| 2020/0072916 A1 | 3/2020 | Alford et al. |
| 2020/0334559 A1 | 10/2020 | Anderson et al. |
| 2020/0348378 A1 | 11/2020 | Alford et al. |
| 2021/0041512 A1 | 2/2021 | Pratt et al. |
| 2024/0118357 A1 | 4/2024 | Labanowski et al. |
| 2024/0350058 A1 | 10/2024 | Deka et al. |

FOREIGN PATENT DOCUMENTS

| | | | |
|---|---|---|---|
| JP | H0432788 A | 2/1992 | |
| KR | 20000039737 A | 7/2000 | |
| WO | WO2013/002159 A1 | 1/2013 | |
| WO | WO-2018111769 A1 * | 6/2018 | ............... B06B 1/06 |
| WO | WO2021/119589 A1 | 6/2021 | |
| WO | WO2022/072578 | 4/2022 | |

OTHER PUBLICATIONS

Dreher et al.; Surface acoustic wave driven ferromagnetic resonance in nickel thin films: Theory and experiment. Physical Review B86—Condensed Matter and Materials Physics; 86(13); 13441; 13 pages; Oct. 1, 2012.

Huang et al.; Theoretical investigation of magnetoelectric surface acoustic wave characteristics of ZnO/Metglas layered composite; AIP Advances; 6(1); 7 pages; Jan. 8, 2016.

Labanowski; Acoustically driven ferromagnetic resonance for device applications; Dissertation; University of California, Berkeley; 2017.

Lebanowski et al.; Effect of magnetoelastic film thickness on power absorption in acoustically driven ferromagnetic resonance; Applied Physics Letters; 111(10); Sep. 4, 2017.

Labanowski et al.; Power absorption in acoustically driven ferromagnetic resonance; Applied Physics Letters; 108(2); Jan. 11, 2016.

Labanowski et al.; Power absorption in acoustically driven ferromagnetic resonance; Supplemental Material; Applied Physics Letters; Jan. 11, 2016.

Sievers et al.; Microwave interferometry for high sensitivity VNA-FMR measurements; IEEE Transactions on Magnetics; 53(4); pp. 1-4; Nov. 1, 2016.

Shibayama et al.; Optimum cut for rotated Y-cut LiNbO 3 crystal used as the substrate of acoustic-surface-wave filters; Proceedings of the IEEE; 64(5); pp. 595-597; May 1976.

Srinivasan et al.; U.S. Appl. No. 18/773,546 entitled "Magnetic multilayered stack based ADFMR sensors with enhances sensitives," filed Jul. 15, 2024.

* cited by examiner

Generating an electrical signal S110

Converting the electrical signal to an acoustic wave S120

Propagating the acoustic wave across a magnetic material S130

Converting the altered acoustic wave to an altered electrical signal S140

Measuring the field S150

FIGURE 35

| Symbol | Name | Symbol | Name |
|---|---|---|---|
| S | Sensor | C⌐ | Coupler |
| ℓ | Attenuator | ⊠c | Hybrid Coupler |
| L | Inductor | M | Matching Network |
| γ | Phase shifter | FC | Field Coil |
| F | Bandpass Filter | (≥) | Comparator |
| Ⓧ | Mixer | Logic | Logic Circuit |
| ▽A | Amplifier | ▷ | Analog to digital coverter |

FIGURE 37

SYSTEM FOR AN ACOUSTICALLY DRIVEN FERROMAGNETIC RESONANCE SENSOR DEVICE

CROSS-REFERENCE TO RELATED APPLICATIONS

This Application is a Continuation Application of U.S. patent application Ser. No. 17/120,907, filed on 14 Dec. 2020, which claims the benefit of U.S. Provisional Application No. 62/948,146, filed on 13 Dec. 2019, both of which are incorporated in their entirety by this reference.

GOVERNMENT RIGHTS IN THE INVENTION

This invention was made with government support under grant #1843519 awarded by National Science Foundation SBIR program. The government has certain rights in the invention.

TECHNICAL FIELD

This invention relates generally to the field of sensors based on ferromagnetic resonance, and more specifically to a new and useful high sensitivity and low noise sensor readout system and method for acoustically driven ferromagnetic resonance.

BACKGROUND

Ferromagnetic resonance (FMR) may be used to measures magnetic properties of materials by detecting the precessional motion in of the magnetization in a ferromagnetic sample. Different types of FMR include externally-driven FMR and current-driven FMR. FMR can be excited using a variety of techniques, like cavity excitation, stripline excitation, spin transfer torque, and spin orbit torque, among others These applications are typically not compatible with device applications. They require large cavities, high power drive and use large sample volume in order to be effective. As such, the use of FMR is largely restricted to large laboratory setups and to research projects. Production ready systems are currently not available. Furthermore, a systems for circuit integration are not available through current implementations.

Other types of magnetic sensors exist but have various limitations. For example SERF and SQUID magnetic sensing approaches can have high sensitivity but at the cost of being large, complex and difficult for system integration. Hall effect sensors and magnetoresistive sensors may be smaller solutions at the cost of sensitivity. Thus, there is a need in the field of magnetic field sensors for an acoustically driven ferromagnetic resonance sensor device. This invention provides such a new and useful system and method.

BRIEF DESCRIPTION OF THE FIGURES

FIG. 35 is a flowchart of a method of a preferred embodiment.
FIG. 37 is a glossary of example circuit subcomponents.

DESCRIPTION OF THE EMBODIMENTS

Figure 1:
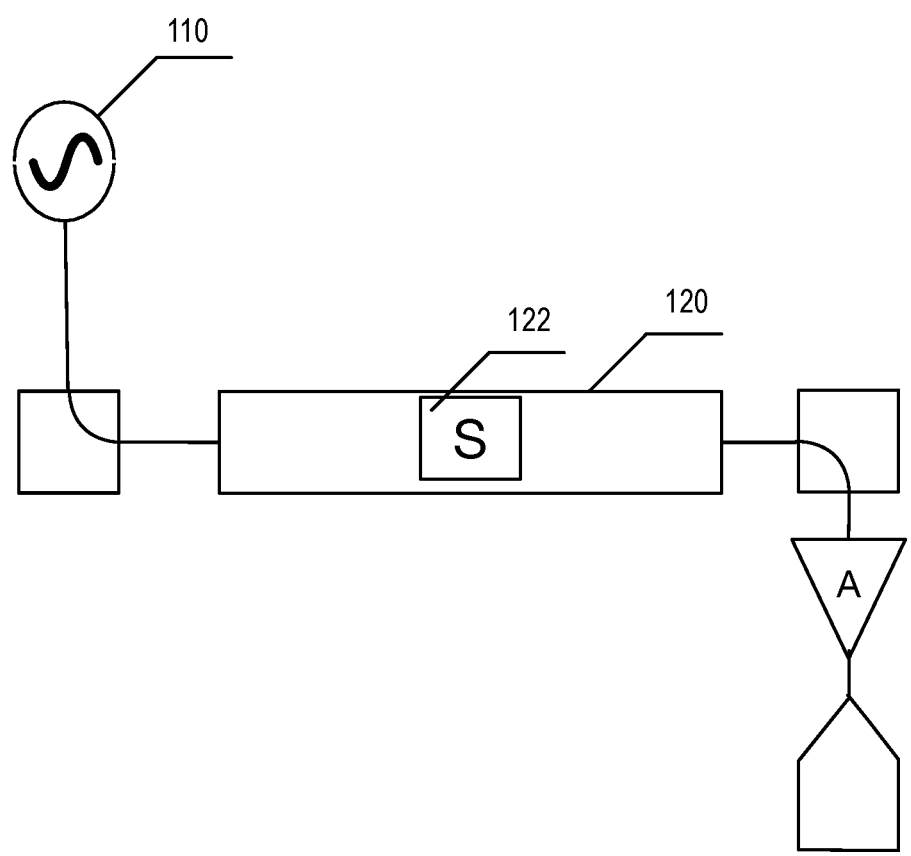
FIG. 1 is a simplified schematic representation of a system of a preferred embodiment.

The following description of the embodiments of the invention is not intended to limit the invention to these embodiments but rather to enable a person skilled in the art to make and use this invention.

1. Overview

A system and method for an acoustically driven ferromagnetic resonance (ADFMR) sensor device functions to facilitate the design and operation of a chip-scale ADFMR device usable to measure an electromagnetic (EM) field. This system and method can preferably measure an EM field using magnetic resonance and then utilize this information to determine the magnitude and/or gradient of the field. The system and method preferably include a voltage oscillator, operating in the order of MHz-GHz that generates an oscillating signal; a power splitter that splits the oscillating signal into a test signal and a reference signal; an ADFMR circuit comprising of an acoustic driven ferromagnetic resonance (ADFMR) device; wherein the ADFMR device alters the test signal with respect to the magnetic field; and a detector uses the altered test signal and reference signal to determine the magnitude and/or gradient of the magnetic field. The ADFMR device can include a base piezoelectric substrate; at least two acoustic transducers on the piezoelectric substrate; and a ferromagnet on the piezoelectric substrate between the at least two acoustic transducers; wherein an acoustic wave is generated from the test signal at a first of the of the at least two acoustic transducers; the acoustic wave propagates along the ferromagnet and excites the ferromagnet to resonance or near resonance; wherein the ferromagnet alters the acoustic wave through absorption; and the altered acoustic wave is converted back to an altered signal at a second of the at least two acoustic transducers. In many variations, the ADFMR device is a surface acoustic wave (SAW) device, wherein SAWs are the acoustic waves utilized to drive the sensor, but any general type of acoustic wave may be implemented with the system and method.

The system and method may provide a number of potential benefits. The system and method are not limited to always providing such benefits and are presented only as exemplary representations for how the system and method may be put to use. The list of benefits is not intended to be exhaustive and other benefits may additionally or alternatively exist.

One potential benefit of the system and method is that the system and method may provide a field sensor device that is compact relative to comparable solutions. Where common implementations are large bench-top laboratory setups, this field sensor device may utilize magnetic resonance to measure a magnetic field without the typical space requirements. More specifically, the system and method may utilize ferromagnetic resonance. This advantage enables the system and method the ability to be implemented in many situations where it was not previously possible. The system and method can preferably provide a chip-scale solution that can be integrated into a circuit design, printed circuit board (PCB). The resulting sensor device may enable CMOS-compatible processing, which can make the sensor device both cheaper and more scalably produced. The system and method can use ADFMR devices to make a magnetic sensor that is easier to integrate.

Another potential benefit of the system and method is that an ADFMR sensor may have enhanced sensitivity compared to other magnetic sensor technology. The system and method may be sensitive to fields over a broad frequency spectrum (0-10 GHz). This may give the advantage of enabling the system and method to be implemented in a broad range of sensor devices.

In combination with the potential benefit of a compact form factor, the system and method may provide a magnetic sensing device that has high sensitivity needed for particular applications while having significantly easier integration in terms of size and device package design. In exemplary fields of use such as magnetoencephalography systems used to measure brain activity, the system and method can achieve needed sensitivity requirements for monitoring of neuronal fields while being chip-based solution.

Another potential benefit of the system is that system and method may require little power to function. This system and method may be implemented using significantly less power as compared to other FMR devices. Low power requirements may give the additional benefit of less heat generation. Low heat generation enables the system and method to be implemented in temperature sensitive environments.

The system and method may be applied to nearly any field that requires field measurement. The small size, low power consumption, and high dynamic range of functionality, enable incorporation of the system and method nearly anywhere. The system and method may be particularly useful in mechanical sensor devices, magnetic imaging, replacement for SQUID devices, and in conjunction with any devices that require field measurement.

The system and method may provide a number of potential benefits. The system and method are not limited to always providing such benefits, and are presented only as exemplary representations for how the system and method may be put to use. The list of benefits is not intended to be exhaustive and other benefits may additionally or alternatively exist.

2. System

As shown in FIG. 1, a system for an acoustically driven ferromagnetic resonance (ADFMR) based sensor includes: a power source 110, that provides an electrical signal to power the system; and an ADFMR circuit 120, i.e. a first "test" circuit, sensitive to electromagnetic fields, wherein the ADFMR circuit comprises an ADFMR device 122, and a detector circuit comprising an analog to digital converter. The system functions to detect and measure external electromagnetic (EM) fields by measuring a perturbation of the electrical signal through the ADFMR circuit due to the EM fields. In some preferred embodiments, the system may include at least one additional circuit (e.g. an additional test circuit, or a reference circuit), wherein the system further includes at least one power splitter 132, wherein the power splitter splits the electric signal to the at least one circuit; and at least one power combiner 134, wherein the power combiner combines the potentially perturbed electric signal output from the ADFMR circuit 120 with other electrical signals.

Figure 2:
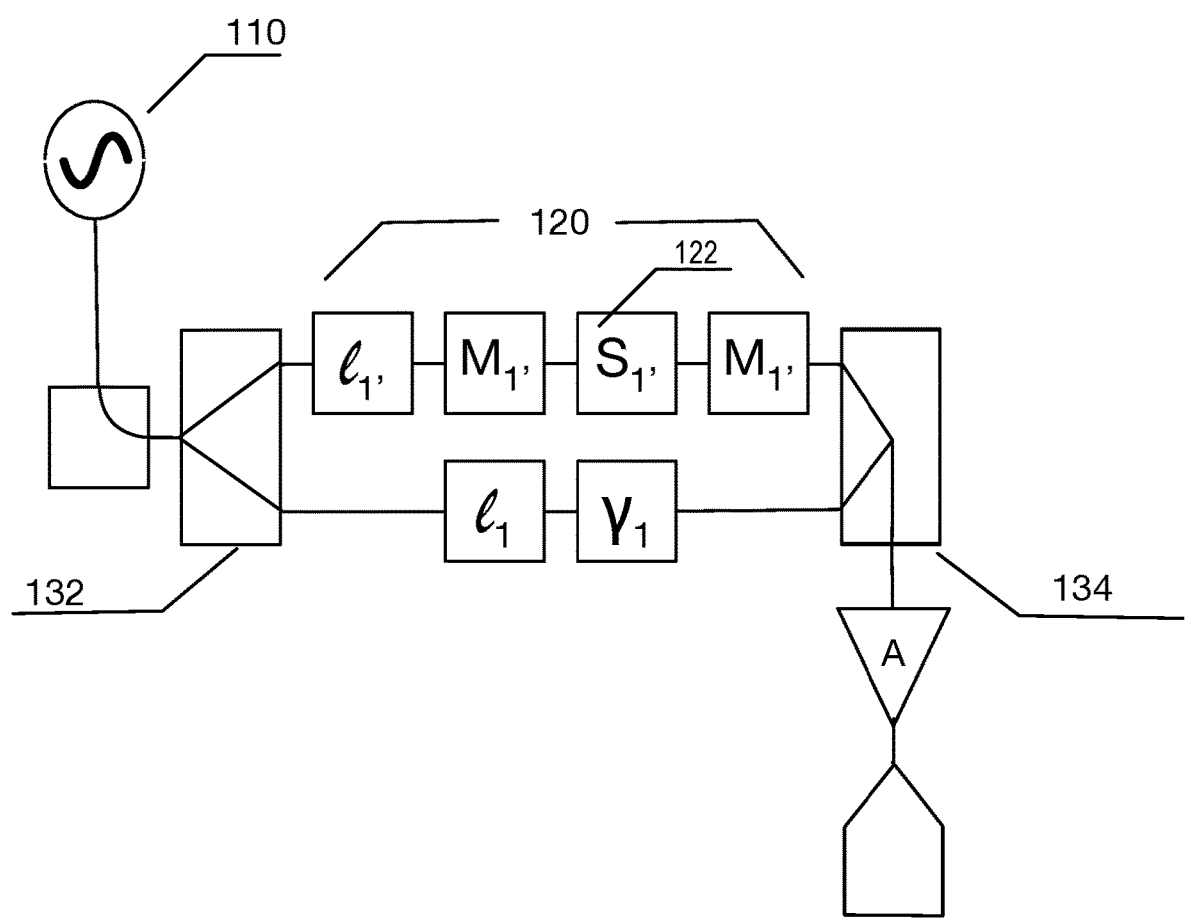
FIG. 2 is a schematic representation of an interferometer system.

In some variations that include at least one additional circuit, as shown in FIG. 2, the at least one additional circuit comprises a first signal processing circuit, wherein the first signal processing circuit is situated parallel to the ADFMR circuit 120 and functions as a "reference" to the ADFMR circuit. This system variation, i.e., interferometer variation, functions to detect and measure external electromagnetic (EM) fields by comparison of a perturbation of the electrical signal through the ADFMR circuit 120, as compared to the unperturbed electrical signal through the first signal processing circuit, i.e., a first reference circuit. That is, in the interferometer variations of the system, the power signal through the ADFMR circuit 120 is perturbed by an external field that is then interfered with an unperturbed reference signal from the reference circuit. The interference (e.g., destructive interference) profile between the test signal and the reference signal, may then be used by the detector circuit to determine the field strength.

Figure 3:
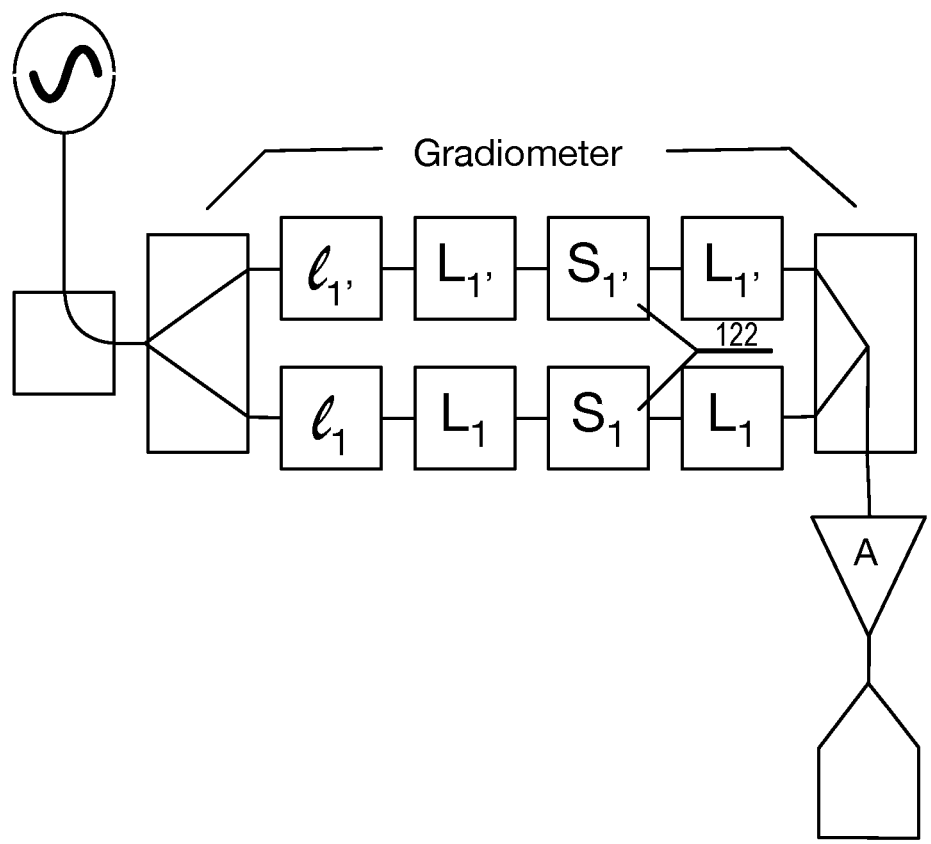
FIG. 3 is a schematic representation of a one-dimensional gradiometer system.

In another variation, as shown in FIG. 3, the system may function to measure the change (i.e., gradient) of external EM fields, i.e., function as a gradiometer. In gradiometer variations, the at least one circuit may comprise an additional ADFMR circuit 120, i.e., a second test circuit that is sensitive to EM fields. In these variations, the difference in measurement between the first test circuit and the second test circuit may be used to determine the gradient of the EM field. That is, in the gradiometer variations of the system, the power signal through both ADFMR circuits 120 are perturbed by the external field. By taking into account the positional dependence of the two circuits, measurement of the gradient of the field can be enabled through interference (e.g., destructive interference) measurements between the two signals.

In many variations, the system may additionally, or alternatively, include subcomponents to increase and/or modify system capability. Examples include: additional ADFMR devices 122 (e.g., enabling multi-dimensional field measurements), amplifiers (e.g., to amplify the power/electrical signal), filters (e.g., to reduce internal and background noise), matching networks (e.g., to match the signal power between parallel circuits), attenuators, phase shifters (e.g., to alter interference patterns between test and reference signal), mixers (e.g., to mix signal frequency), magnetic field coils (e.g., to shift the signal band), and any other desired components. Examples of potential system subcomponents include: signal amplifiers (A), bandpass filters (F), attenuators (1), inductors (L), phase shifters (y), couplers (c), mixers (X), matching networks (M), analog to digital converters (ADC), digital to analog converters (DAC), and comparators (≥), logic circuits, and field coils. The system may include any other desired components as applicable. Implementations of some of these components will be discussed further on. FIG. 37 includes a glossary of terms and symbols of subcomponents implemented in some variations of the system.

These subcomponents may enable many additional variations. For example, the system may comprise: variations optimized for low energy consumption, as shown in one example in FIG. 4; variations to reduce noise, as shown in one example in FIG. 5 example; and variations that optimize the sensitivity and/or operating range of the system, as shown in one example in FIG. 6. The system may additionally, or alternatively, comprise any combination or additional variation, as desired.

The system may include circuits and circuit segments, parallel or in series, as part of the system. These circuits may contain any circuit subcomponents (e.g., the aforementioned subcomponents), as desired for functionality. As used herein, the term "circuit" will be used generally, to refer to either an entire circuit, or a circuit segment. That is, a circuit will not necessarily form a closed loop per se, but with the combination of additional circuits, that may or may not be explicitly presented here, the circuit may function as part of a closed loop.

Figure 6:
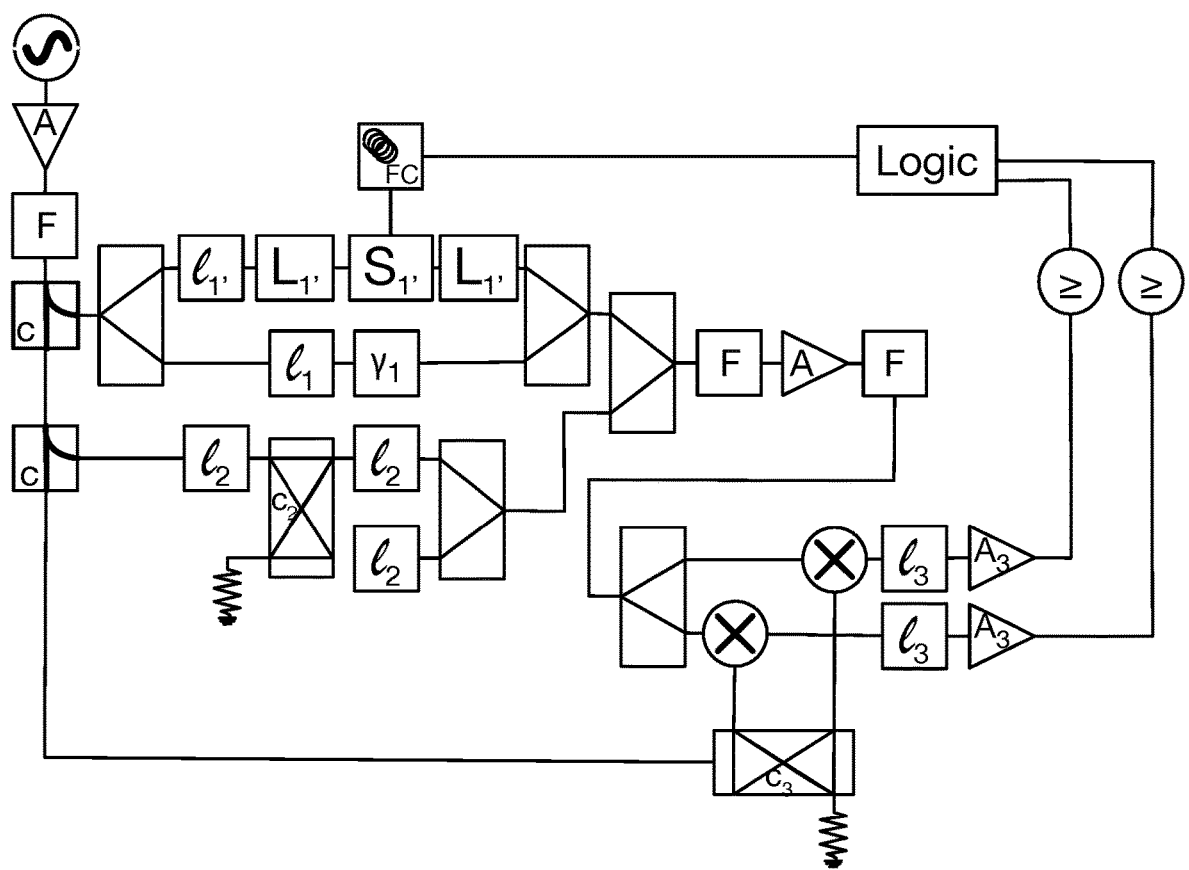
FIG. 6 is a schematic representation of a large disparity EM field interferometer.
Figure 7:
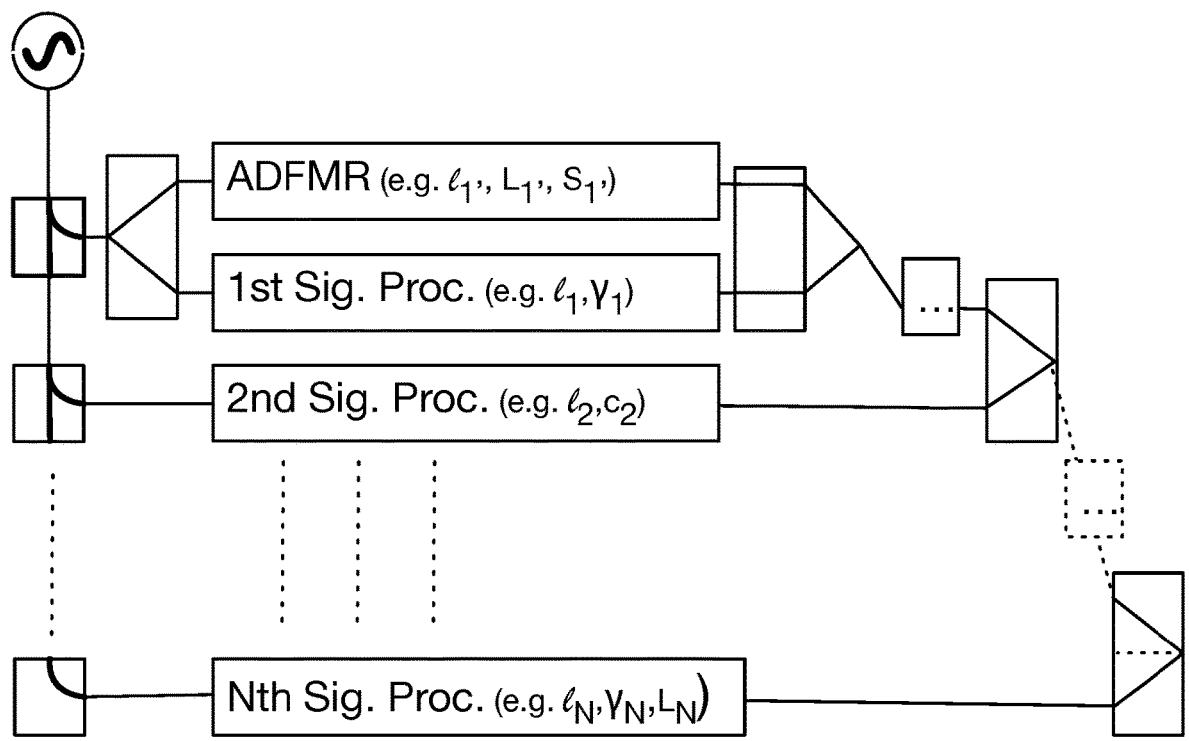
FIG. 7 is a general circuit schematic representation of an interferometer system.
Figure 8:
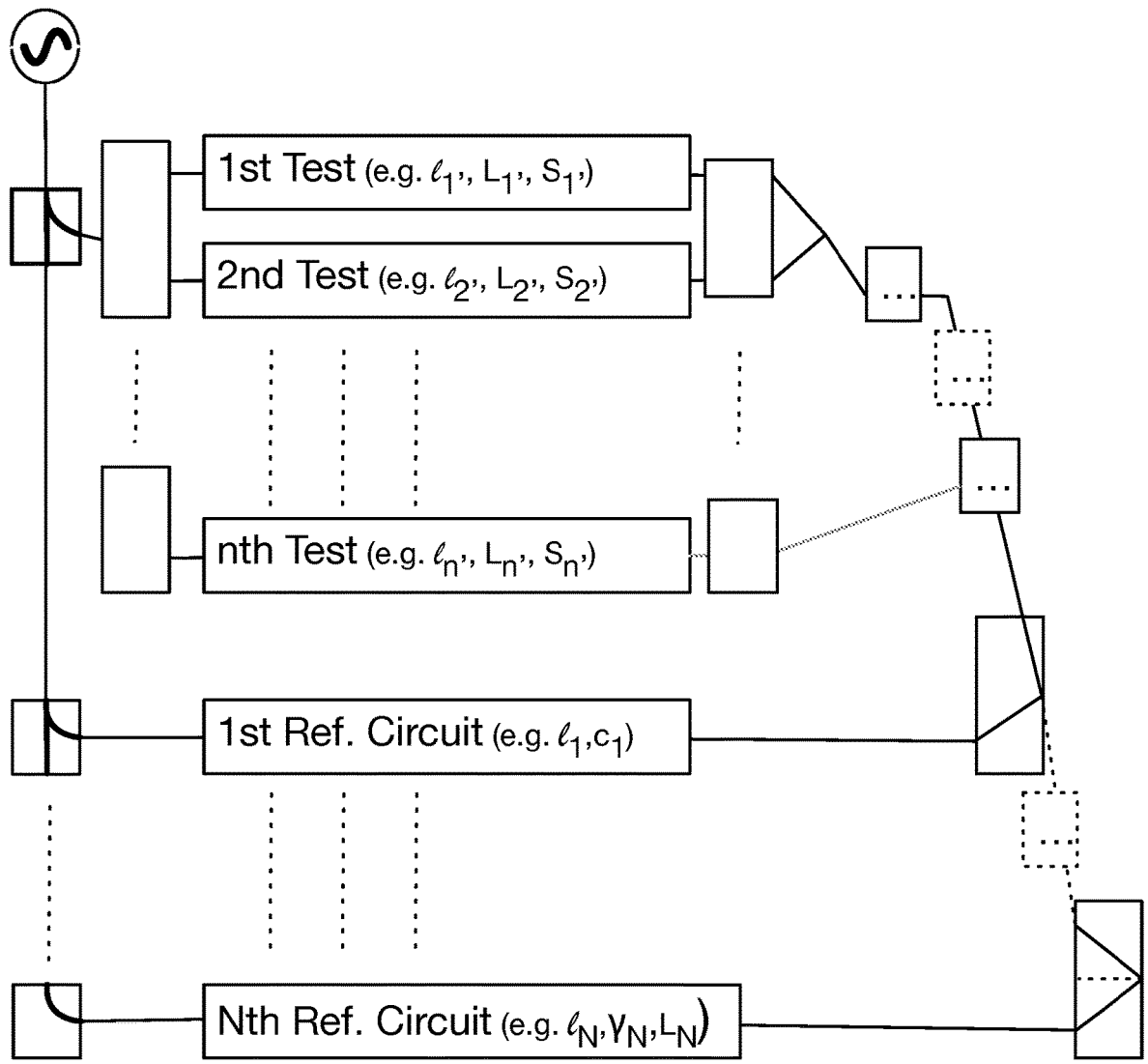
FIG. 8 is a general circuit schematic representation of the system.

As shown in FIG. 7 and FIG. 8, numbering for circuits refer to the number of test circuits (shown with primed subscript numbers), circuits that include an ADFMR device subcomponent; and signal processing circuits (shown with subscript numbers). Test circuits may also be referred to as ADFMR circuits or sensor circuits. Additionally, the first test circuit may also be referred to without a numbering, e.g., the test circuit, or the ADFMR circuit. Although circuits are shown numbered only in parallel in the figures, variations of the system may include that test circuits and/or signal processing circuits in other non-parallel configurations within the circuit (e.g., as shown in FIG. 6).

In a general circuit layout of the system, as shown in FIG. 8, the system may comprise "n" test circuits and "N" signal processing circuits, wherein n and N are arbitrary whole numbers determined by the specific implementation. Circuit subcomponents, i.e., components on a specific circuit, may be referred to with a subscript referring to the circuit number, wherein primed subscripts will be used for test circuit subcomponents (e.g., $L_{2'}$ refers to an inductor on a second test circuit) and non-primed subscripts will be used for signal processing circuit subcomponents (e.g., $L_2$ refers to an inductor on a second signal processing circuit). In some variations, certain subcomponents may appear in regions where it is not clear which circuit these components belong to. These subcomponents may be included without any subscript, or may include a subscript to connect it with a desired circuit (e.g., when the subcomponent has a complementary functionality with the desired circuit).

As part of a circuit designation, circuit subcomponents may be described as upstream or downstream in relation to each other. Herein, "upstream" and "downstream" are used to refer to the direction of power traveling through the circuit. That is, a subcomponent 'A' downstream from subcomponent 'B' would refer to a positionality where the power travels from subcomponent 'B' to subcomponent 'A', with or without other components in between. A subcomponent 'A' upstream from subcomponent 'B' would refer to a positionality where the power travels from subcomponent 'A' to subcomponent 'B', with or without other components in between.

A system may include a power source 110. The power source functions as an energy source, providing an electrical signal to the system. In some variations, the power source 110 is an electronic oscillator. The electronic oscillator functions to provide the system with an oscillating voltage, i.e., an alternating current (AC) power signal, wherein the power from the oscillator is used to activate the sensor circuit. Alternatively, other types of currents may be used, e.g., direct current (DC).

In some variations, the electronic oscillator is a voltage-controlled oscillator (VCO). Preferably the frequency of the oscillator is in the order of gigahertz. More preferably ~2 GHz. High frequency pulsing of the oscillator may enable fast turn-on and turn-off times of the sensor. Fast turn-on/turn-off times may be on the order of microseconds or faster. As the ADFMR device 122 may function with MHz oscillations, the oscillator may alternatively be in any range that enables ADFMR functionality, that is in the order of MHz to GHz.

The system may include at least one ADFMR circuit 120. The ADFMR circuit 120 functions as a "test" circuit that includes an ADFMR device which enables sensor activity for the system. The ADFMR circuit 120 may also be referred to as a sensor circuit or a test circuit. Dependent on the variation, the system may include one, or multiple, ADFMR circuits 120; wherein each ADFMR circuit may share ADFMR devices 122 between them, have a single ADFMR device, or have multiple ADFMR devices. In some variations, the system may include a set of ADFMR circuits. Multiple ADFMR circuits 120 may be used for gradient field measurements, multidimensional field measurements, and/or to improve field measurement precision (e.g., through overlapping measurements). ADFMR circuits 120 are positioned downstream of the power source 110, such that the electrical signal provided by the power source may be implemented as a test signal along the ADFMR circuits.

Figure 9:
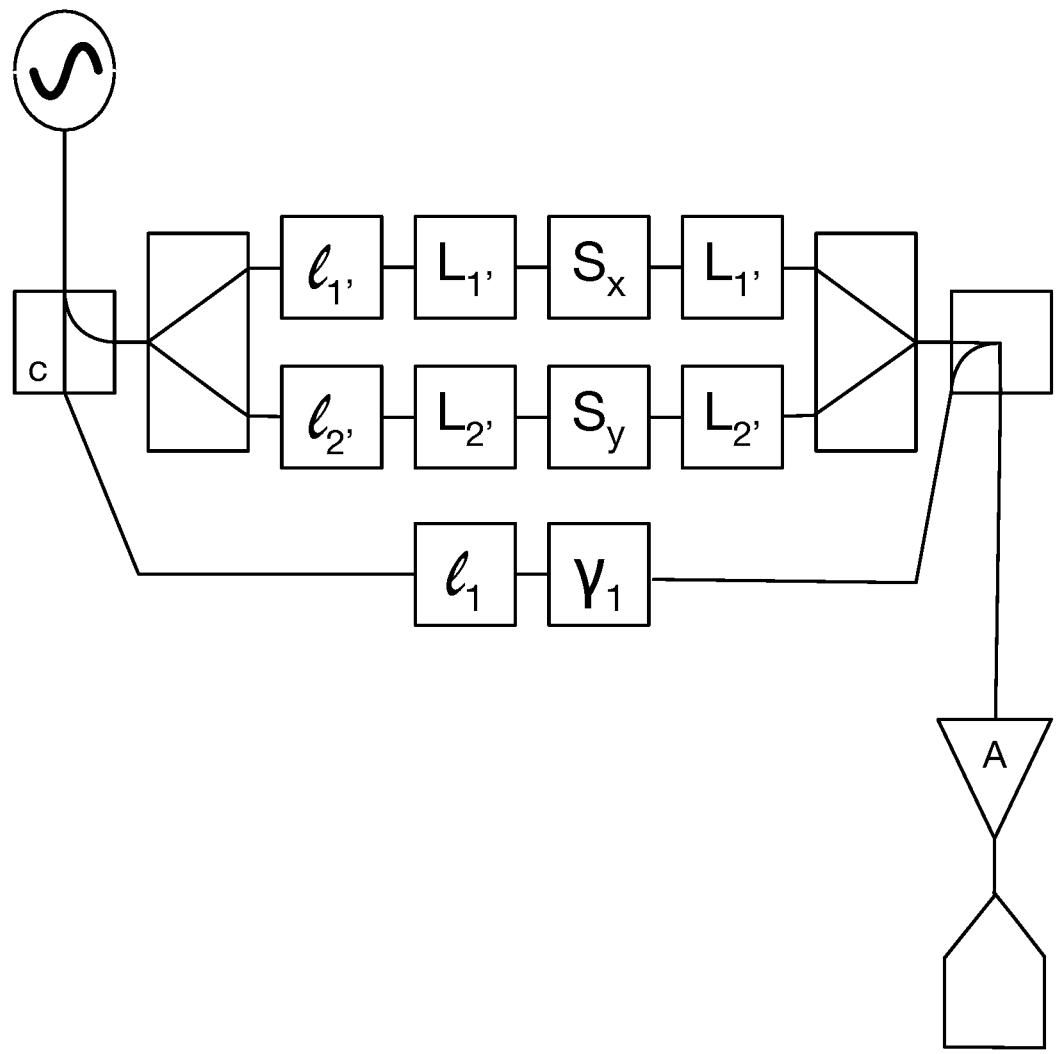
FIG. 9 is a schematic representation of a two test circuit, two-dimensional interferometer.
Figure 10:
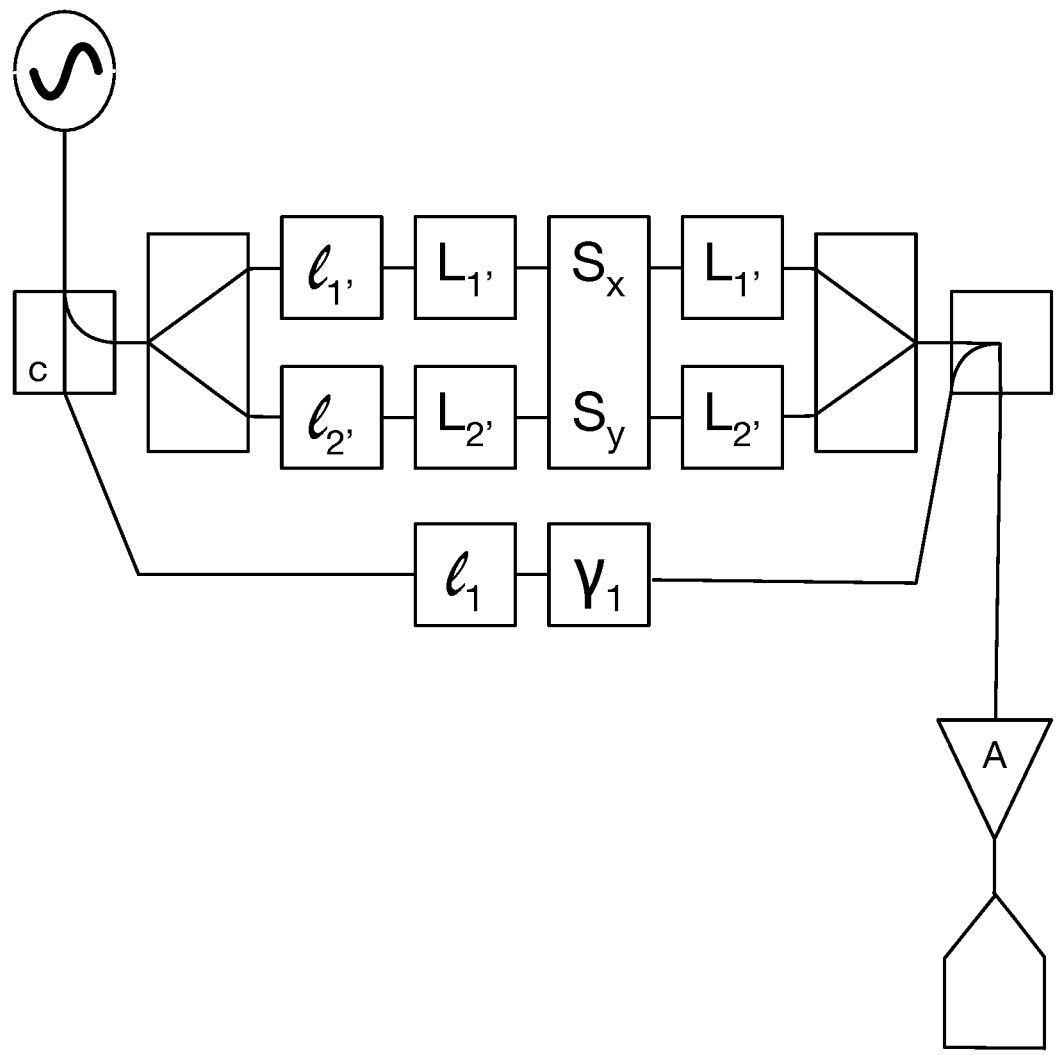
FIG. 10 is a second schematic representation of a two test circuit, two-dimensional interferometer.

In some variations, the system may comprise multiple ADFMR devices 122, distributed on ADFMR circuits 120, In one variation, multiple ADFMR circuits 120 measuring one, or multiple, dimensions may be implemented on a single chip, much similar to the layout as shown in FIG. 9 or FIG. 10. Dependent on the desired implementation, each dimensional functionality may be activated or deactivated.

Figure 11:
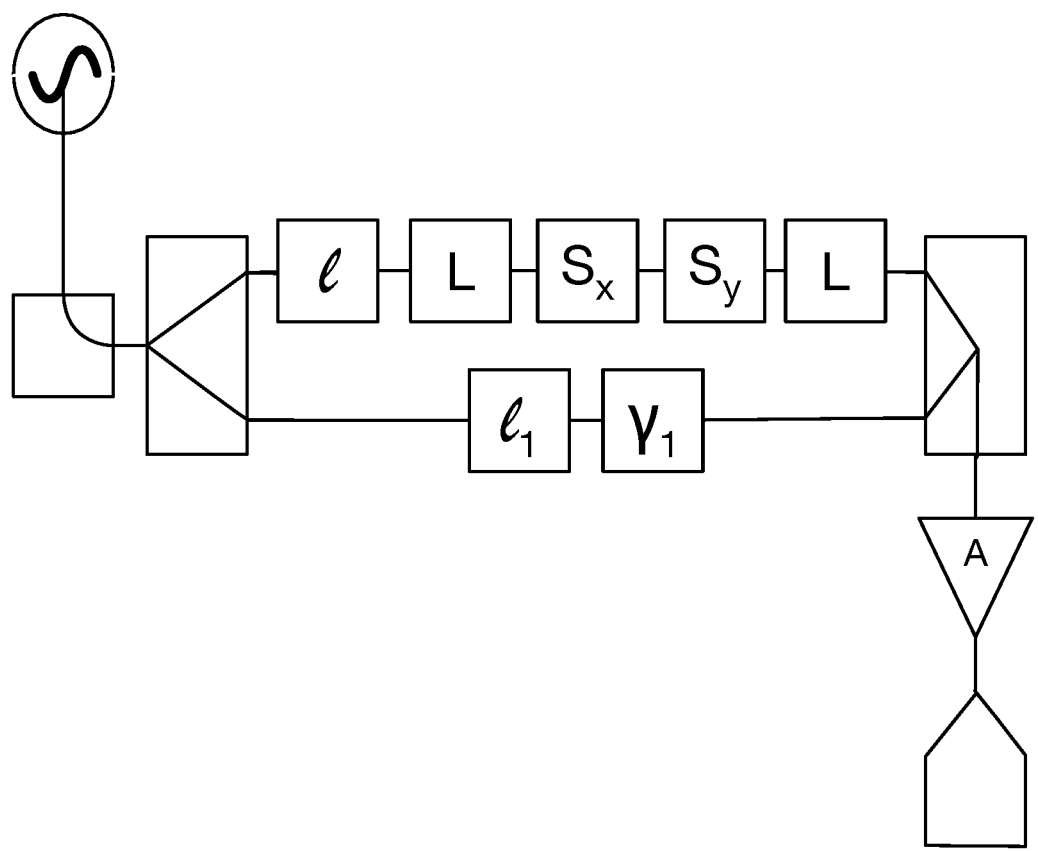
FIG. 11 is a schematic representation of a one test circuit, two-dimensional interferometer.

In one variation, a single ADMR circuit 120 measuring one, some, or all desired dimensionalities may be implemented on a single chip, much similar to the layout as shown in FIG. 11. Dependent on the desired implementation, each dimensional functionality may be activated or deactivated.

The ADFMR device 122 is preferably a component of the system, and additionally, a subcomponent of the ADFMR circuit 120. The ADFMR device 122 functions as a device that "measures" EM fields by enabling modification of a radio frequency (RF) carrier signal (i.e., the test signal) using acoustically driven magnetic resonance. In many variations, the magnetic resonance is implemented with a ferromagnetic (i.e., ferromagnetic resonance), but may be implemented with any magnetic material. Examples of other types of magnetic material include: anti-ferromagnets, ferrimagnets, etc. That is, although the device is referred to as an ADFMR device 122, the ADFMR device may in actually be a, e.g., ferrimagnetic resonance device. The ADFMR device 122 may include: at least one acoustic transducer, that generates and/or absorbs acoustic waves; an acoustic resonator, that provides a medium for acoustic wave propagation; and a magnetic material, that perturbs the acoustic wave due to EM fields using magnetic resonance.

The ADFMR device 122 preferably includes an acoustic transducer. The acoustic transducer functions to convert the test signal to an acoustic wave, and/or convert the acoustic wave to an RF signal (e.g., an altered test signal). The acoustic transducer functions to generate and/or absorb acoustic waves (or pressure waves), from an electrical signal, that propagate along the acoustic resonator (e.g., piezoelectric substrate).

Preferably, the acoustic transducers are implemented in pairs, wherein one transducer generates the acoustic wave that then propagates to the other acoustic resonator that is then absorbed by the second transducer. That is, a first acoustic transducer converts the test signal traveling through the ADFMR circuit 120 into an acoustic wave; wherein the acoustic wave propagates in, or along, the ADFMR device 122 to a second acoustic transducer, which then converts the acoustic wave to an electrical signal. Alternatively, a single acoustic transducer may both convert the RF test signal to an acoustic wave, and the acoustic wave back into an RF signal. For example, an electrical signal may be converted into an acoustic wave by an acoustic transducer, the acoustic wave propagates out and is then reflected back to the acoustic transducer, which then converts the acoustic wave back into an electrical signal. In other examples, multiple acoustic transducers may be implemented both to generate and to absorb the acoustic waves. That is, multiple acoustic transducers may be implemented per ADFMR device 122, wherein a single, or multiple, RF signals may be converted to acoustic waves and/or acoustic waves converted to RF signals; once, or multiple times.

The acoustic transducer preferably generates an acoustic wave appropriate to the type of ADFMR device 122. Examples of generated acoustic may include: surface acoustic waves (SAWs), bulk acoustic waves (BAWs), and lamb waves. The specific acoustic transducer may be implementation specific. The type of acoustic transducer may be dependent on the electrical signal (e.g., signal frequency, signal power), and/or the type of acoustic wave generated (e.g., surface acoustic, bulk acoustic waves). For example, in variations wherein the system uses lamb waves, the acoustic transducer may comprise of electromagnet-acoustic transducers (EMAT). In variations wherein the system uses SAWs, the acoustic transducer may comprise interdigital transducers (IDTs). Alternatively, other types of transducers (e.g., film bulk acoustic resonators, high-overtone bulk acoustic resonators) may be implemented that either generate SAWs or other types of acoustic waves. The acoustic wave is preferably generated at, or near, the resonance frequency of the ferromagnet. The acoustic wave is preferably propagated in, or along, the acoustic resonator through the ferromagnet. Thus, the acoustic wave may enable the ferromagnet to function at, or near, resonance.

Figure 12:
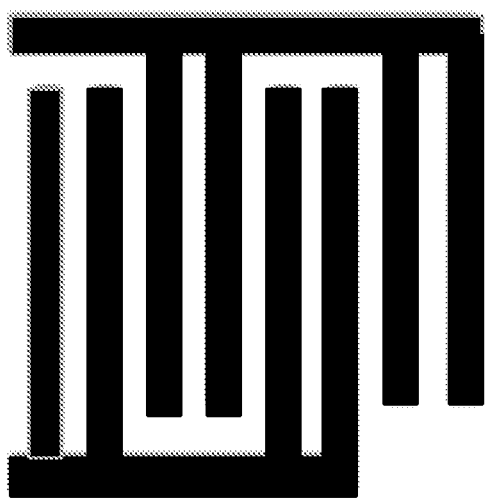
FIG. 12 is a sample illustration of an interdigitated transducer (IDT).

In some variations wherein the system uses SAWs, the acoustic transducer may comprise an IDT. The IDT may function to generate a SAW from an electrical signal (or generate an electrical signal from a SAW) using the piezoelectric effect. The IDT is a device comprising of interlocking comb-shaped arrays of metallic electrodes, forming a periodic structure, positioned on a piezoelectric substrate (e.g., quartz, lithium niobate). The IDT may have any desired configuration/shape. One example IDT configuration is shown in FIG. 12. For the pairs of IDTs, preferably one functions as an input IDT and one functions as an output IDT. The input IDT may convert a radio frequency (RF) electrical signal to a surface acoustic wave (SAW) using the piezo-electric effect. The output IDT functions by absorbing the SAW and converting it back to an electrical signal.

The ADFMR device 122 may include an acoustic resonator. The acoustic resonator functions as a medium to enable propagation of acoustic waves. The acoustic resonator may enable wave propagation through a volume (e.g., BAWs), along the surface of a medium (e.g., SAWs), through the cavity of a medium (e.g., sound waves propagating through an air cavity of the acoustic resonator). The acoustic resonator may be composed of any material that enables the desired type of acoustic wave propagation. In some variations the acoustic resonator is composed of a piezoelectric substrate (e.g., quartz). In some variations, the acoustic resonator may comprise the main "body" of the ADFMR device 122, wherein all other components are situated on, or around, the acoustic resonator.

In some variations, the acoustic resonator is a piezoelectric substrate. The piezoelectric substrate enables formation and propagation of acoustic waves by the piezoelectric effect. The piezoelectric substrate may be composed of any desired piezoelectric compound (e.g., most crystal or ceramic compounds). In one preferred variation a Y-cut lithium niobate substrate is used as the piezoelectric substrate. In some variations that include two acoustic transducers, the length of space between the two acoustic transducers (i.e., delay line) is 1-3 mm. In one example, a piezoelectric substrate (e.g., zinc-oxide) is deposited underneath or above the two IDTs on the ADFMR base (e.g., diamond base material).

The ADFMR device may include a magnetic material, preferably a magnetostrictive material. The magnetostrictive property may enable the magnetic material to convert strain into a change in magnetization, or enable the conversion of a change in magnetization into strain. The only limitation on the magnetic material is that the magnetic material may achieve resonance on a macroscopic scale (i.e., resonance beyond the excitation of individual molecules and/or atoms). Examples of magnetic material include, ferromagnets, ferrimagnets, anti-ferromagnets, paramagnets, diamagnets, etc. In some variations, the magnetic material may comprise a ferromagnet, and/or a ferromagnetic mixture. The magnetic material functions to absorb acoustic waves, wherein at resonance the absorption is very sensitive to magnetic fields. Preferably, the magnetic material is positioned in the path of the acoustic wave (along the delay line), such that the local magnetic field sets the magnetic material's resonant frequency to, or close to, the acoustic wave frequency—thereby enabling the magnetic material to effectively absorb the acoustic wave and thus change the propagating acoustic wave with respect to the magnitude of the field. In preferred variations, the ferromagnet is laid in between the two acoustic resonators (e.g., as a magnetic film), wherein the thickness and length of the magnetic material plays a significant role in absorption, thus the magnetic material may be of varying thickness and be of different length dependent on implementation. For ferromagnetic variations, examples of implemented types of ferromagnets include iron, nickel, and cobalt, but may be any suitable type of ferromagnet. In some variations, the system may be implemented with other magnetic materials, for example: paramagnets, diamagnets, ferrimagnets, antiferromagnets, or any combinations of these materials. Similar to the ferromagnet variation, the magnetic material may be implemented at or near resonance to absorb magnetic fields.

In some variations, the ferromagnetic has a spatial orientation. That is, the ferromagnetic may be built and oriented such that EM fields with one spatial orientation (e.g., x-direction) may affect the interaction between the magnet and the acoustic wave, wherein fields from other orientations may leave the ferromagnet unaffected. In this manner, dependent on implemented ferromagnet, the ferromagnet (and thus the ADFMR device 122) may be sensitive to one, two, or three spatial dimensions.

In some variations, the ADFMR device 122 may include a signal detector. The signal detector functions to measure the output power signal from the ADFMR device 122. Since the output power signal may have been perturbed by the applied field, the output power signal may be used to determine the field strength. The signal detector may additionally include noise reduction functionalities. In one variation, the signal detector may perform a Fourier transform to separate the desired output signal from other extraneous Electromagnetic (EM) waves. For example, an input acoustic transducer may additionally generate extraneous EM waves. The signal detector may perform a Fast Fourier Transform to isolate and remove these extraneous waves from the desired signal. Due to the time delay of acoustic wave propagation, as compared to EM wave propagation, other time dependent methods may be used to separate acoustic waves from EM waves. For example, in one implementation, the electronic oscillator may be cycled on and off for fixed periods of time, enabling measurement of the propagating acoustic waves during the electronic oscillator off cycle, thus potentially removing undesired signals.

Figure 13:
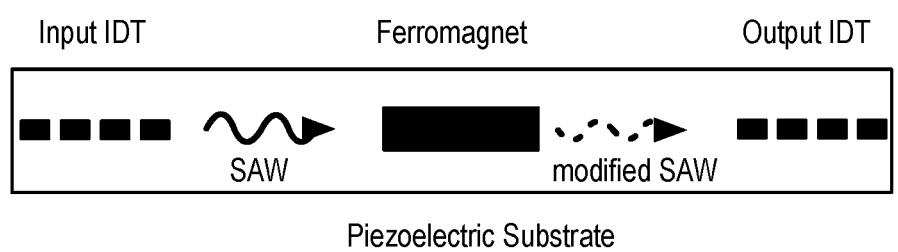
FIG. 13 is a schematic representation of a surface acoustic wave (SAW) device.
Figure 14:
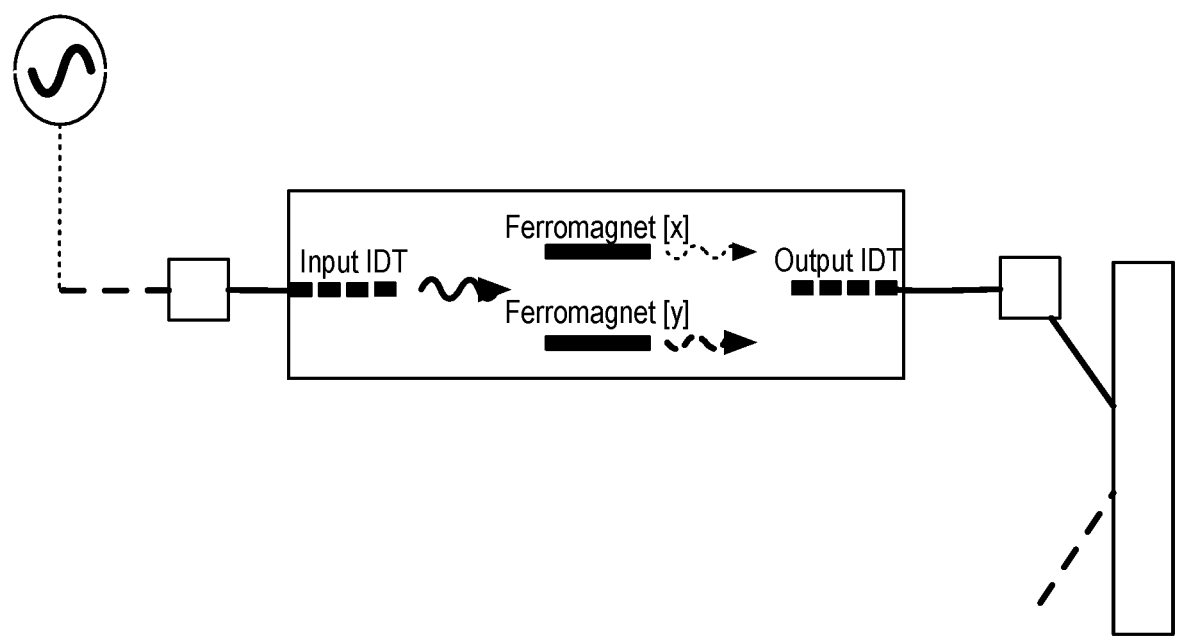
FIG. 14-18 are schematic representations of alternate variations of the SAW device.
Figure 15:
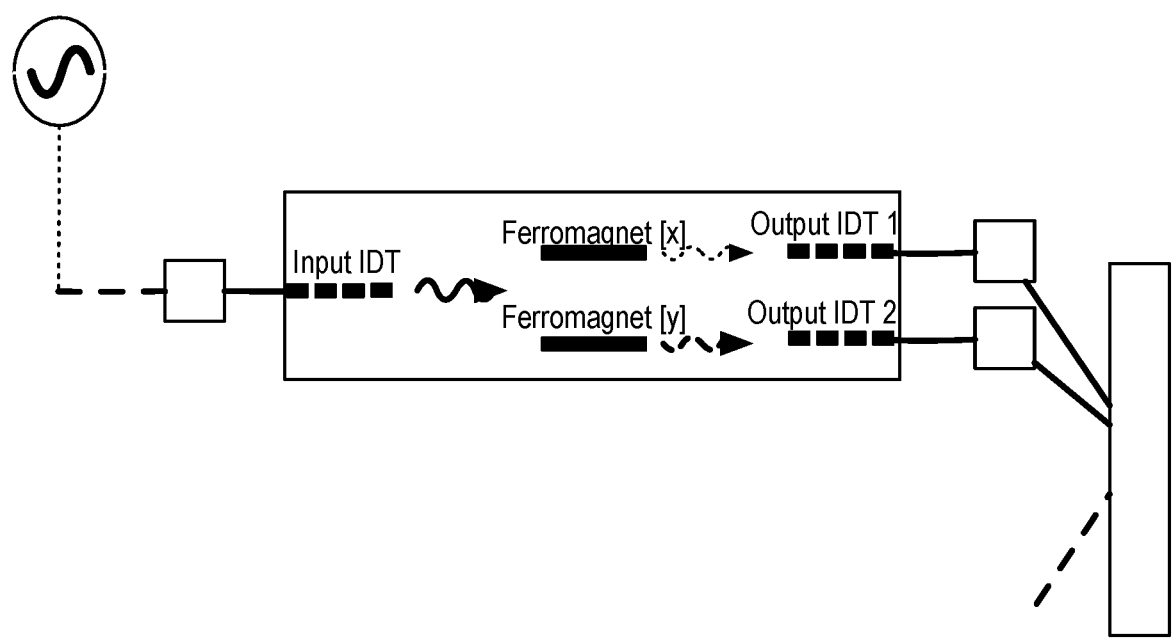
Figure 16:
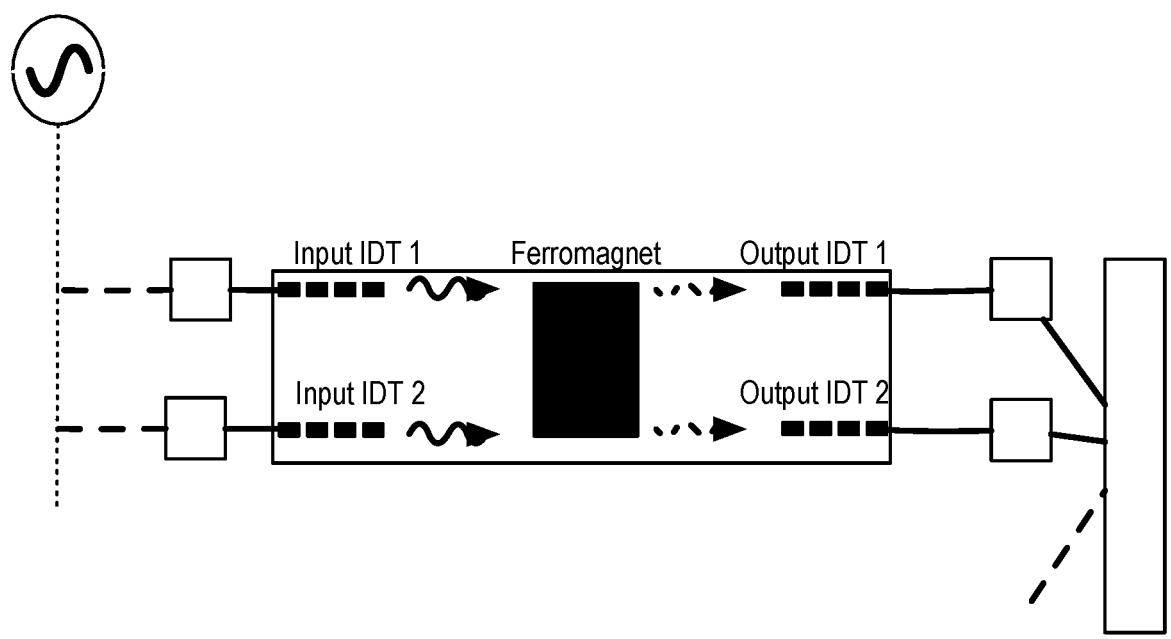
Figure 17:
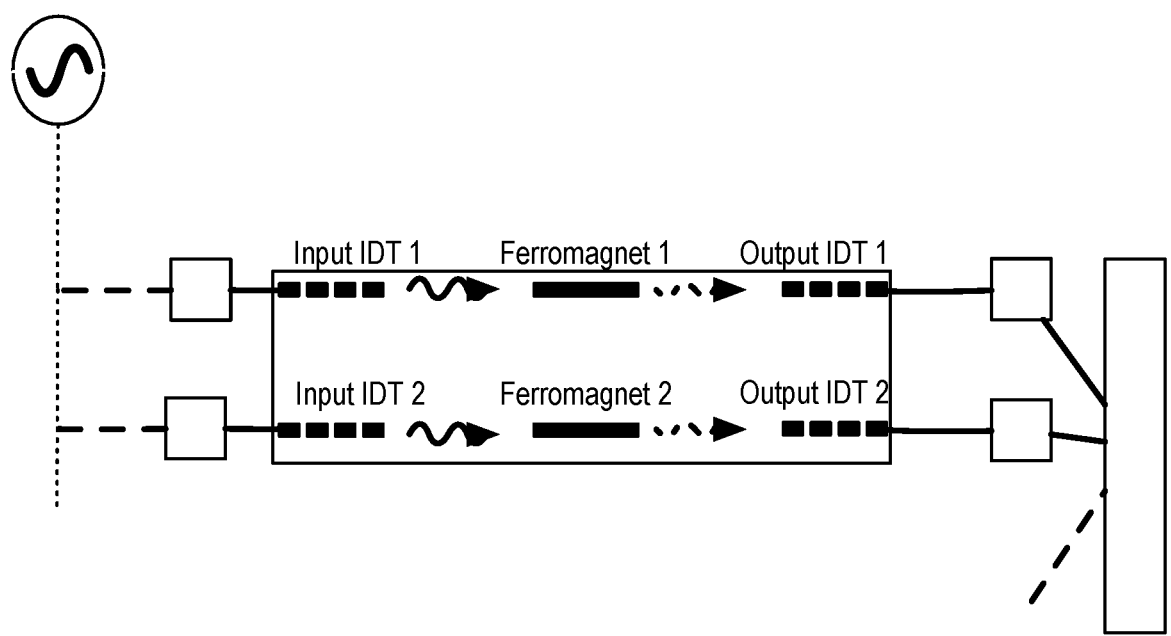
Figure 18:
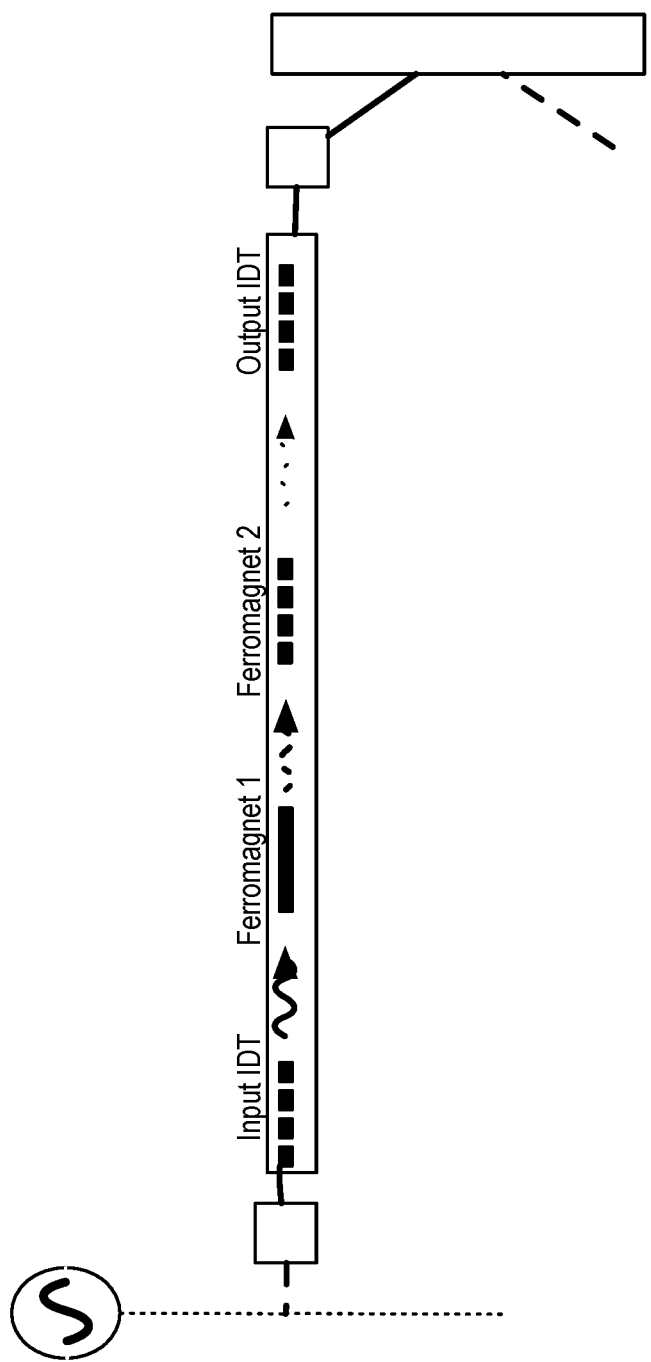

In some variations, as shown in the example FIG. 13, the ADFMR device 122 may be a SAW device. That is, in one SAW device example, the ADFMR device 122 may comprise: two IDTs, an input IDT and an output IDT; positioned along a piezoelectric substrate; wherein a magnetic film is positioned along the piezoelectric substrate in between the two IDTs. The specific configuration and shape of the SAW device may vary dependent on implementation. Example variations include: having a single SAW device per ADFMR circuit 120 (e.g., the FIG. 13 SAW device); having spatially oriented ferromagnets (one or more) on the SAW device, for a multidimensional field sensor, as shown in FIG. 14 and FIG. 15; utilizing a single SAW device with a single ferromagnet between multiple ADFMR circuits 120, as shown in FIG. 16; utilizing a single SAW device with multiple ferromagnets, either as an interferometer or gradiometer implementation, as shown in FIG. 17; having multiple distinctly oriented ferromagnets in series (e.g., as part of a serial multi-dimensional sensor), as shown in FIG. 18. Specific variations may include fewer, or additional components, as desired or necessary.

In some variations, the ADFMR device includes a field coil (FC). The field coil could be a direct current (DC) coil and/or any suitable coil or system for creating a magnetic field. Any other suitable component that can create a field to offset the power output may be used. The field coil functions to generate a magnetic field bias to positively or negatively offset the output of the ADFMR device 122. In one variation, the field coil reduces the power output by inducing a reduced external field that the ADFMR device 122 is exposed to. The field coil may be implemented to offset the power output to a small output regime wherein circuit components function linearly, thereby reducing systematic error to non-linearities. For example, an amplifier may have a much smaller range of linear amplification as compared to the ADFMR device 122 output. Reducing the range of the sensor output would thus enable linear functionality of the amplifier. The field coil could potentially apply a magnetic field at any frequency (or combination of frequencies) as needed. For example, if the system were exposed to a large unwanted signal from power lines (e.g., 60 Hz) in addition to the Earth's field, the unwanted power line alternating field as well as the Earth's field could be cancelled out. The field coil may be used to apply any suitable type of canceling magnetic field.

Figure 19:
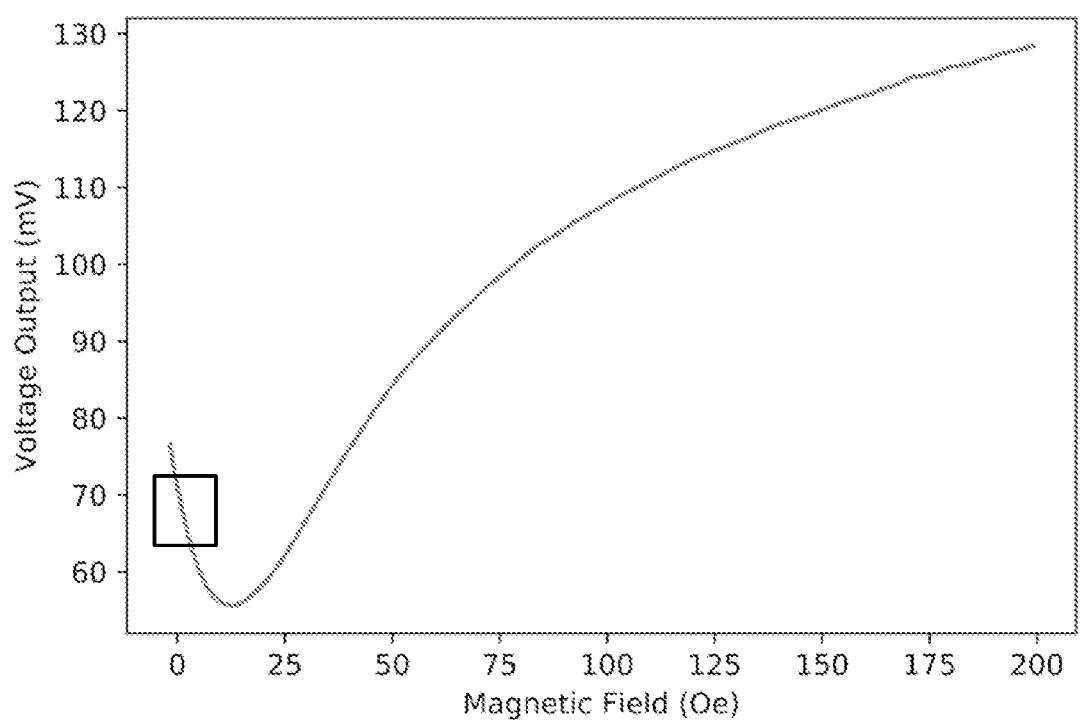
FIG. 19 is one example plot of the absorption spectrum of a ferromagnetic as a function of applied field strength.

The field coil may offset the power output to any desired range. In some variations, the field coil may offset the external field to near zero. In other variations, the field coil may alternatively, or additionally, offset the magnetic field to a range where the ADFMR sensor functions optimally. For example, in implementations where the system is used as a gradiometer, the field coil may offset the magnetic field to the regime where a change in the external field would lead to the largest change in power output (e.g., inflection point of the output power spectra). FIG. 19 shows a sample absorption spectrum as a function of the external field. Thus, for a given frequency, the field coil may enable modification of the external field such that activity is centered around an inflection point of the curve.

The system may include a detector circuit. The detector circuit functions to take the output of the ADFMR circuits 120 (i.e., the potentially perturbed electrical signal), and any other components, and determine the EM field strength. In many variations the detector circuit comprises an analog to digital converter (ADC). An ADC functions to convert an analog signal to a digital signal. In some variations, the ADC may be utilized to convert the output signal to a digital signal for analysis. In some variations, ADCs may be implemented for each circuit (including the ADFMR circuit 120). In these variations the ADC converts the signal output of the circuit into a digital output prior to combining the circuit signals. All circuit digital outputs may then be combined to a digital output signal.

In variations that include parallel circuits, the system may additionally include power splitters 132 and/or power combiners 134. The power splitter 132 functions to split the power signal into multiple parts, enabling the connection of an additional parallel circuit component; and the power combiner 134 functions to combine multiple circuits. In many variations, the power splitter 132 enables splitting the original power signal into a test signal and a reference signal. Additionally or alternatively, the power splitter may split the power signal into multiple test signals and/or multiple reference signals. In addition to other properties, the power splitter/combiner set enables the functionality of an interferometer for field measurement. That is, a power signal may be split into two parts (e.g., test and reference signal), wherein one (or both) signals may be altered (e.g., through power absorption of a field through the ADFMR device). The field may then be measured by examining the interference pattern generated once the two signals are combined. The system may include a pair of power splitter/combiners for each parallel circuit included in the system. Alternatively, the system may include more, or fewer, power splitter/combiner pairs for each parallel circuit included in the system. In some variations, the system may include an unequal number of power splitters 132 and power combiners 134 (e.g., one split power signal may be connected to a ground and not require a power combiner).

For some multi-dimensional implementations field detection, the system may include additional power splitters/combiners to enable the addition of ADFMR circuits 120. For example, as shown in FIG. 9, for an implementation enabling measurement of fields in a plane, the system may include a power splitter 132 that splits the circuit into a first test circuit and a second test circuit; and a power combiner 134 that combines the first ADFMR circuit 120, that measures the field in an "x-direction", and a second ADFMR circuit, that measures the field in a "y-direction". The system may additionally have a second pair of power splitters/combiners (instead of the shown couplers), wherein the power signal is initially split into a reference signal and a test signal. Alternatively, as shown in FIG. 11, a single test circuit may have multiple ADFMR devices 122 in series (e.g., with different orientations), such that their orientation enables measurement of the field in multiple dimensions. In some variations, these ADFMR sensors in series may function simultaneously, wherein other variations they may alternate.

As discussed previously, the system may additionally include a combination of various subcomponents. Example subcomponents include: signal amplifiers, bandpass filters, attenuators, inductors, phase shifters, couplers, mixers, matching networks, field coils, and comparators. Subcomponents may be incorporated on test circuits, signal processing circuits, or on any other part of the system as desired.

In some variations, the system includes at least one amplifier (A). An amplifier functions to increase the signal strength. The amplifier may help counteract the effects of power dissipation and reduced power due to splitting the original power. The amplifier may be an active or passive amplifier.

In some variations, the system may include attenuators (1). An attenuator functions to reduce the power of the signal without affecting the signal waveform. In some variations, attenuators are implemented to reduce noise. Additionally, the attenuators may match the power signal amplitude between parallel circuits (e.g., between a test circuit and a reference circuit). Attenuators may be digital or analog. In some variations digital attenuators are used to maximize removal of i/f "pink" noise; noise proportional to the power. Analog attenuators also reduce i/f noise, but are dependent on the noise signal of their control voltage. In some variations, the ADFMR circuit 120 may include an attenuator.

In some variations, the system includes at least one bandpass filter (F). A bandpass filter functions by narrowing the electrical signal band, thereby enabling a narrower wave band for application and/or analysis. This may additionally be the case once a signal is amplified which may naturally broaden signal spectrum.

In some variations, the system includes at least one inductor (L). An inductor functions to store energy in a magnetic field. Matching inductors may match the impedance of the transducer to any circuit component adjacent to the transducer. In some variations, the system may include matching inductors that match acoustic transducers to mixer input.

In some variations, the system includes at least one phase shifter (y). The phase shifter function by "shifting" the phase of the electrical signal. The phase shifter may be implemented to apply constructive or destructive interference between parallel circuits that are then combined. This is particularly important in implementing an interferometer.

In some variations, the system may include at least one mixer (i.e., frequency mixer (X)). The mixer functions to combine two electrical signals into one. The mixer may multiply signals enabling frequency mixing. In some variations, the mixer may bring down a ~1 Ghz frequency from the ADFMR device 122 to a 0 frequency DC. Additionally, the mixer may enable mixing the original power source 110 signal with the ADFMR device 122 output to remove electronic oscillator noise.

In some variations, the system includes at least one coupler. A coupler functions by coupling power travelling through one circuit to another circuit, enabling the same signal to be used in another circuit. In some variations the coupler may be used instead of a power splitter to maintain the same level of power in both paths. In some variations, the system may additionally include a hybrid coupler. The hybrid coupler enables coupling two input sources to two output sources. In some preferred variations, the hybrid coupler is implemented two split a single input source and shift the phase of the output sources.

In some variations, the system includes at least one matching network. The matching network may comprise a combination of inductors and capacitors. The matching network may function to both make an impedance match between the acoustic transducer and adjacent circuit components (e.g., mixer input) and allow the transducer impedance to appear high such that it can be attached to a high-efficiency (low power) oscillator. In some variations, matching networks may match the impedance of the transducer to any circuit component adjacent to the transducer. In some variations, the system may include matching networks that match acoustic transducers to mixer input.

In some variations, the system includes at least one comparator ($\geq$). The comparator functions to detect the sign of the output signal, i.e., positive, negative, or zero. The comparator may be used with a logic circuit, to enable incremental changes to the output signal.

As mentioned previously, the system includes at least one ADFMR circuit 120 (i.e., a first ADFMR circuit), comprising, at least, one ADFMR device 122; wherein each ADFMR circuit includes an ADFMR device subcomponent and/or shares an ADFMR device subcomponent with other ADFMR circuits (e.g., as shown in FIG. 10). The ADFMR circuit 120 functions to measure the external magnetic field. Dependent on variation, each ADFMR circuit 120 may be identical or distinct. The ADFMR circuit 120 may have additional subcomponents depending on implementation. For example, in one implementation, the ADFMR circuit 120 may include matching networks. In other variations, the ADFMR circuit 120 may include inductors and/or attenuators. The ADFMR circuit 120 may additionally or alternatively have other components, such as an amplifier or a phase shifter.

In a "low-power" variation, the ADFMR circuit 120 includes a matching network. In this variation, the matching network may function to match the impedance of the ADFMR circuit with another circuit. In this variation, the system may include a high-impedance power source (e.g., oscillator), and the acoustic transducers of the ADFMR device may be lower-impedance.

In another variation, the ADFMR circuit 120 includes: a digital attenuator upstream of the ADFMR device 122; and two matching inductors, one upstream and one downstream of the ADFMR device. The digital attenuator lowers the power and may help reduce i/f noise as compared to analog attenuators. The matching inductors may match the impedance between the IDTs in the ADFMR device 122 and other components (e.g., mixer).

Figure 20:
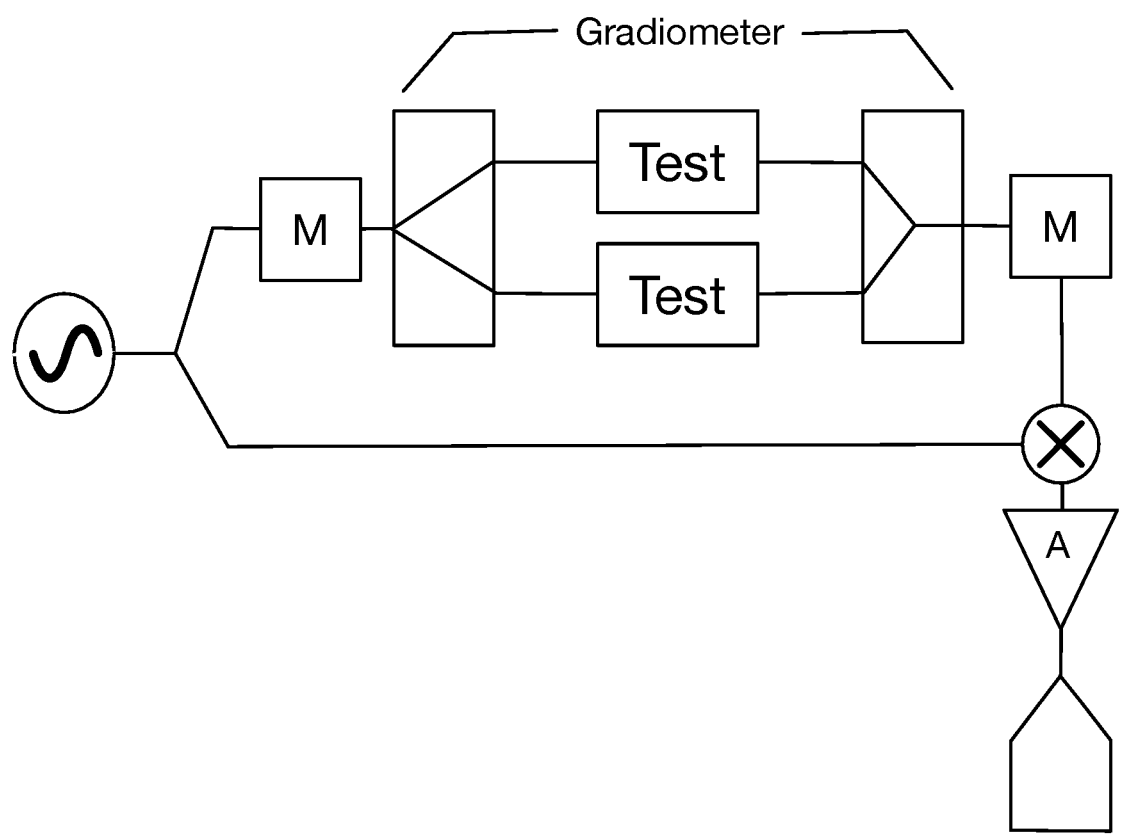
FIG. 20 is a schematic of a circuit representation of a gradiometer.

In some variations, the system may comprise a plurality of ADFMR circuits (e.g., a first ADFMR circuit, a second ADFMR circuit, etc.). The plurality of ADFMR circuits 120 may function to enable extra and/or improved sensing functionality for the system. In some system embodiments, multiple ADFMR circuits 120 (e.g., a first test circuit, and a second test circuit) may be situated in parallel in distinct spatial positions, such that the system may function as a gradiometer. Any reference to a gradiometer will thus refer to at least two ADFMR circuits 120 in parallel, and a set of power splitter/combiners that split and combine the original power signal into two test signals, as seen in the example schematic of FIG. 20. Additional circuits (e.g., additional test circuits and/or signal processing circuits) and additional subcomponents may be generally added dependent on desired implementation, wherein additional subcomponents may still be both in serial or parallel as desired for an implementation.

The system may include at least one signal processing circuit, e.g., a first signal processing circuit. The signal processing circuit may be parallel to the ADFMR circuit 120. Alternatively, the signal processing circuit may be serial to the ADFMR circuit 120. Dependent on implementation, signal processing circuits may be identical or distinct, and may play many functional roles as part of the system. In some variations, the first signal processing circuit is a reference circuit parallel to the ADFMR circuit 120.

Dependent on the implementation, the first signal processing circuit, i.e., reference circuit may function with the ADFMR circuit 120, such that the two together function as an interferometer. In these implementations, the reference circuit may include a phase shifter and an attenuator. Any reference to an interferometer will thus refer to an ADFMR circuit 120 a reference circuit, and a set of power splitter/combiners that split and combine the original power signal into a test signal and a reference signal as seen in the example schematic of FIG. 4. Additional circuits (e.g., additional test circuits and/or signal processing circuits) and additional subcomponents may be generally added dependent on desired implementation, wherein additional subcomponents may still be both in serial or parallel as desired for an implementation. The reference circuit phase shifter may function to change the phase of the reference signal such that the reference circuit can destructively interfere with the ADFMR circuit 120.

Figure 21:
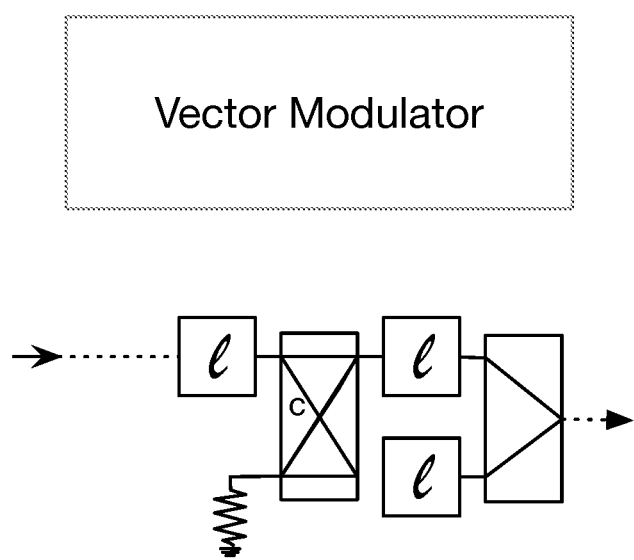
FIG. 21 is a schematic of a vector modulator circuit.
Figure 32:
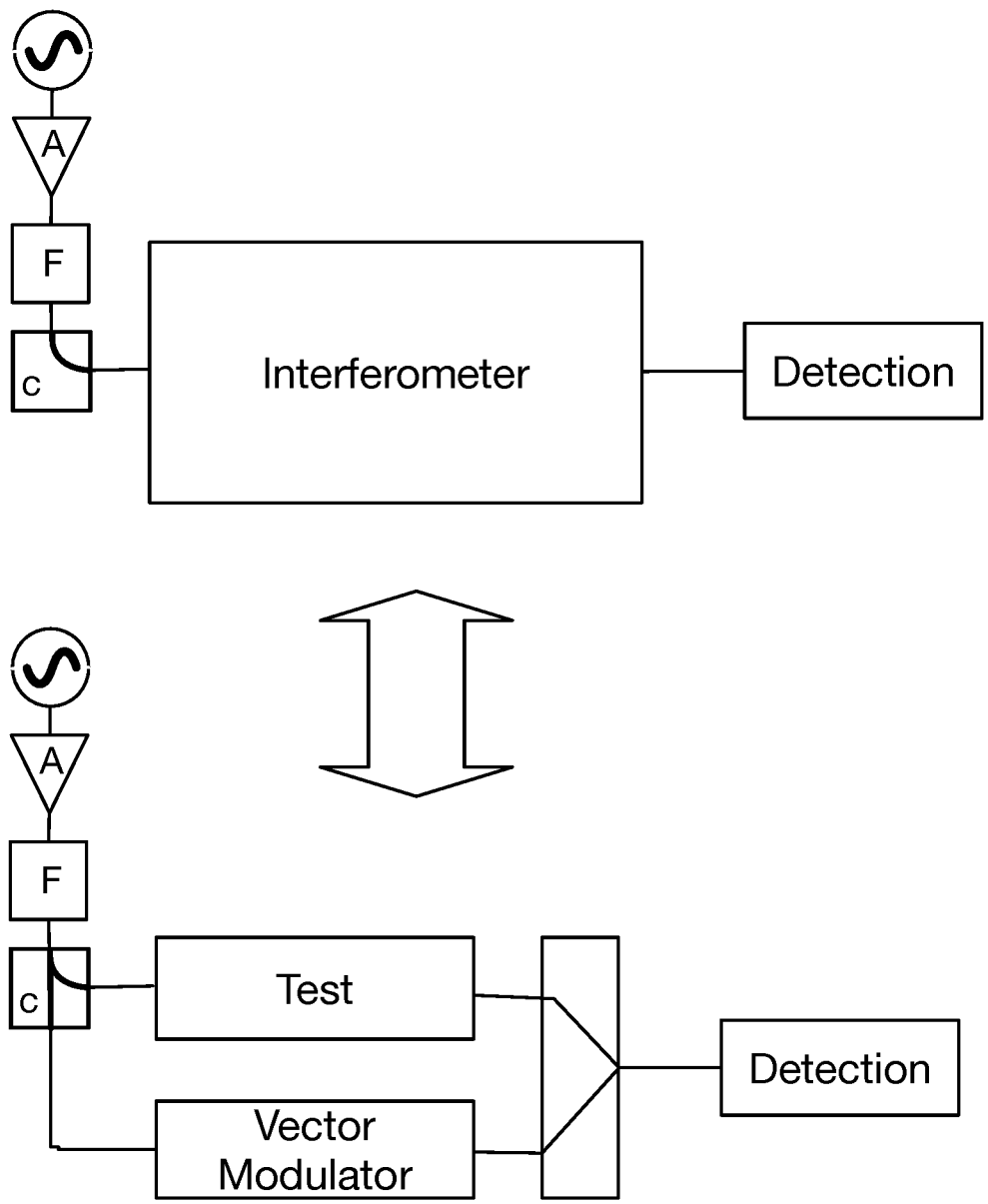
FIG. 32 is a schematic for a circuit representation of an interferometer with a vector modulator circuit.

In some variations, the system includes a signal processing circuit that is a vector modulator circuit, as shown in the example schematic of FIG. 21. The vector modulator circuit is preferably parallel to the ADFMR circuit 120, although it may be in series with the ADFMR circuit. The vector modulator circuit functions as a reference circuit, where in conjunction with a test circuit forms an interferometer. The vector modulator circuit may additionally function to reduce noise (e.g., as analog subtraction circuitry), although it may have other or additional functionalities. The vector modulator circuit preferably includes at least one attenuator. In one preferred example, the vector modulator circuit includes an upstream attenuator, a hybrid coupler feeding the output from one the one upstream attenuator into two downstream attenuators, the outputs of which are then recombined. The two downstream attenuators may enable implementation of any desired phase shift in the power signal. The vector modulator circuit may enable implementing any desired phase while only using attenuators, thereby minimizing noise due to phase shift. In some variations, the vector modulator circuit may function as the only reference circuit, and in conjunction with the test circuit, function as an interferometer circuit, as shown in FIG. 32. The vector modulator circuit may additionally, or alternatively, function in conjunction with a distinct interferometer circuit or a gradiometer circuit, wherein the vector modulator circuit reduces the signal amplitude not coming from the signal of interest.

Figure 22:
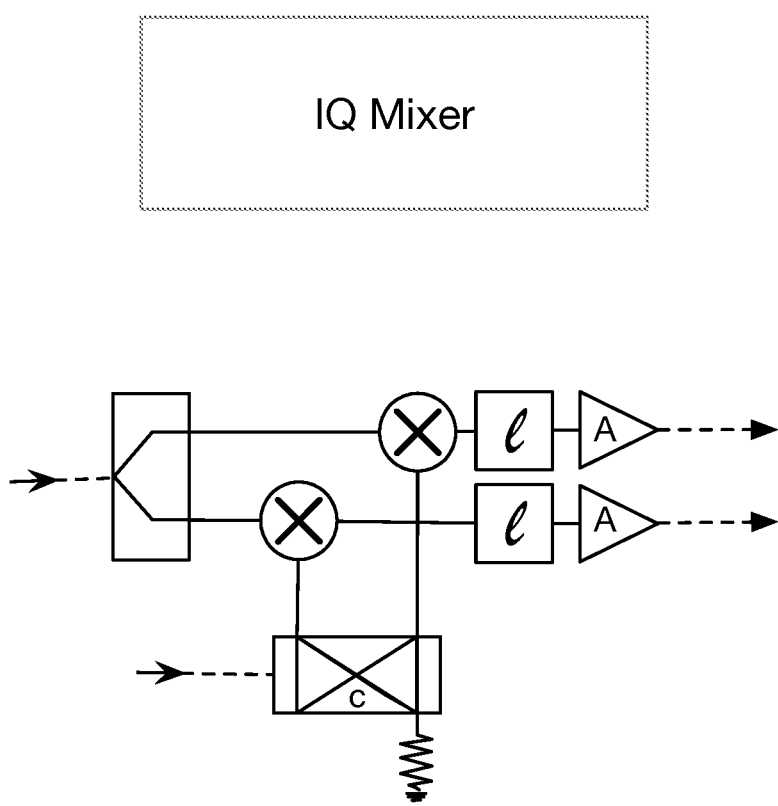
FIG. 22 is a schematic of an IQ mixer circuit.

In some variations, as shown in the example schematic of FIG. 22, the system includes a signal processing circuit that is an IQ mixer circuit. The IQ mixer circuit may be parallel to the ADFMR circuit 120. Alternatively, it may be in series with the ADFMR circuit 120. The IQ mixer may include: a power splitter 134, to split the power in half; a mixer downstream of the power splitter connected to a hybrid coupler, to shift half the power signal out of phase; and a mixer downstream of the power splitter, connected to the non-shifted output of the hybrid coupler, that mixes the other half of the power signal without shifting the signal. The IQ mixer may function to enable better measurement of the amplitude and phase of the power signal, by creating a linear combination of an 'in-phase' power signal, and a 90 degree 'out-of-phase' power signal. Additionally, the IQ mixer circuit may function to center and normalize the test signal, but may include other, or additional functionalities. The IQ mixer circuit may be implemented in conjunction with either an interferometer circuit or a gradiometer circuit.

Figure 23:
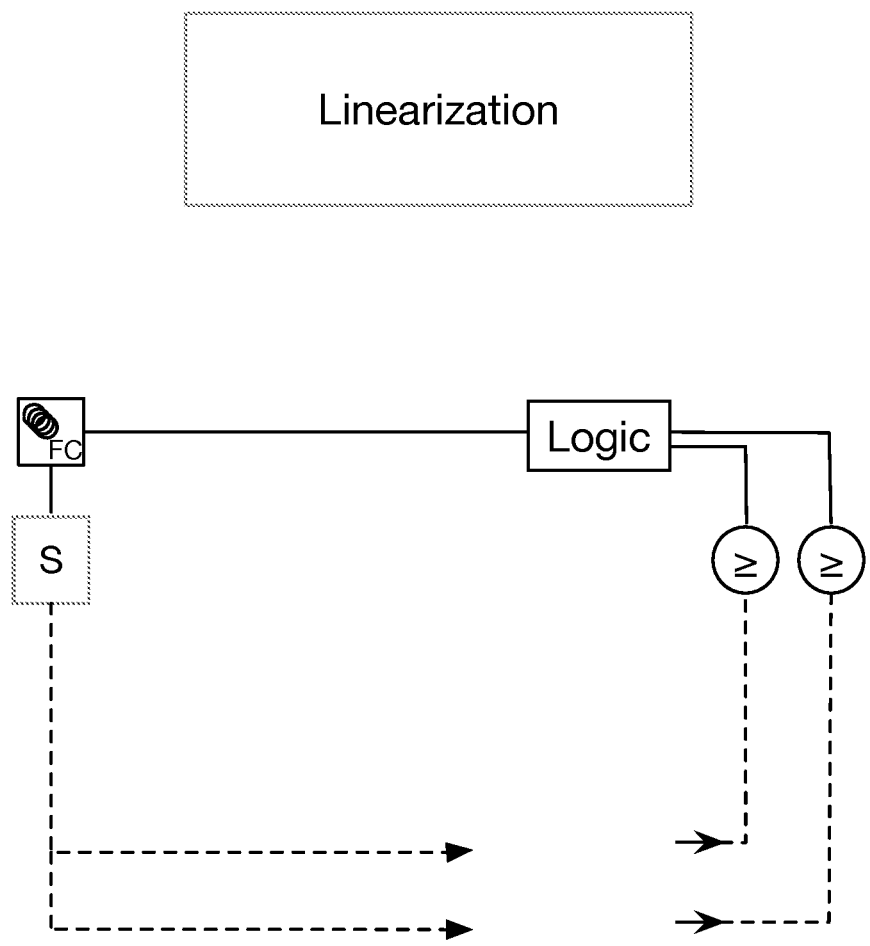
FIG. 23 is a schematic of a linearization circuit.

In some variations, as shown in the example schematic of FIG. 23, the system includes a signal processing circuit that is a linearization circuit. In some variations the linearization circuit is in series with the ADFMR circuit 120, although it may be parallel to the ADFMR circuit. In one example implementation of the linearization circuit, the linearization circuit may include at least one comparator and a logic circuit. The linearization circuit functions to minimize non-linear outputs of the system subcomponents, by narrowing the output voltage of the system to a smaller, "more" linear regime. The linearization circuit may function in conjunction with the magnetic field coil as a feedback loop directed by the logic circuit; wherein the logic circuit directs the magnetic field coil current using input information from the comparator. The linearization circuit may be implemented with any desired ADFMR circuit 120.

The linearization circuit may be configured to function in a "setup" mode, prior to final measurement of a field. Setup mode functions to bring the voltage output of the ADFMR circuit 120 and/or the external field applied to the ADFMR circuit to an optimally desired measuring/output regime (i.e., desired regime of activity). The linearization circuit, through the setup mode, may incrementally modify the magnetic field with the field coil voltage. Through cycles, the field coil voltage may be increased, or decreased, until the desired regime of activity for the field has been reached. Once the desired regime has been reached, the setup mode may stop and a measurement of the effective field made. By taking into account the current, or voltage, supplied to the field coil, the actual field strength may be determined. Alternatively, the linearization circuit may include a simpler field detector to determine the approximate desired voltage and enable the field coil to reach the desired region of activity in one, or just fewer incremental, cycles (e.g., implementation of a field-programmable gateway array).

In one example utilizing the linearization circuit, the desired regime of activity for the external field is 0 (or near 0) and the field coil is a DC coil. In this example, during the setup mode, the voltage of the DC coil may be increased, or decreased, until the effective field on the sensor is close to 0. Once the effective field is sufficiently close to 0, the ADFMR circuit may then make a "final" measurement of the effective field. The system, using the voltage passed through the DC coil, may then calculate the actual field strength.

Figure 24:
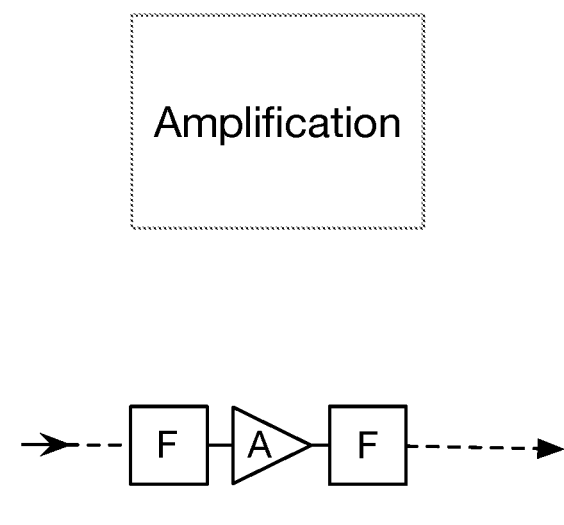
FIG. 24 is a schematic of an amplification circuit.

In some variations, as shown in the example schematic of FIG. 24, the system may include a signal processing circuit that is an amplification circuit. The amplification circuit may be in series with the ADFMR circuit 120 and functions to amplify the power signal (e.g., a test signal). The amplification circuit preferably includes at least one amplifier. In some variations the amplification circuit includes a bandpass filter upstream and downstream of the amplifier to maintain a narrow power spectrum. The amplification circuit may be implemented to make up for power dissipation and/or decreased power due to circuit splitting.

Figure 25:
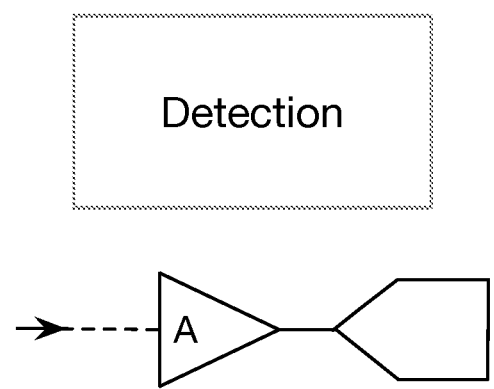
FIG. 25 is a schematic of a detection circuit.

In some variations, as shown in the example schematic of FIG. 25, the system may include a detection circuit. The detection circuit functions to "read out" the output voltage of the system as an applied field. Generally speaking, this requires normalizing the output signal and converting it to a quantity analyzable by the detection circuit. The detection circuit preferably functions in conjunction with the IQ mixer circuit, but may be implemented independent of the detection circuit. Any general detection circuit that can function in the desired range may be utilized for this functionality. In one preferred variation, the detection circuit includes an amplifier and an analog to digital converter (ADC). Additionally, the detection circuit may include an inductor.

Figure 26:
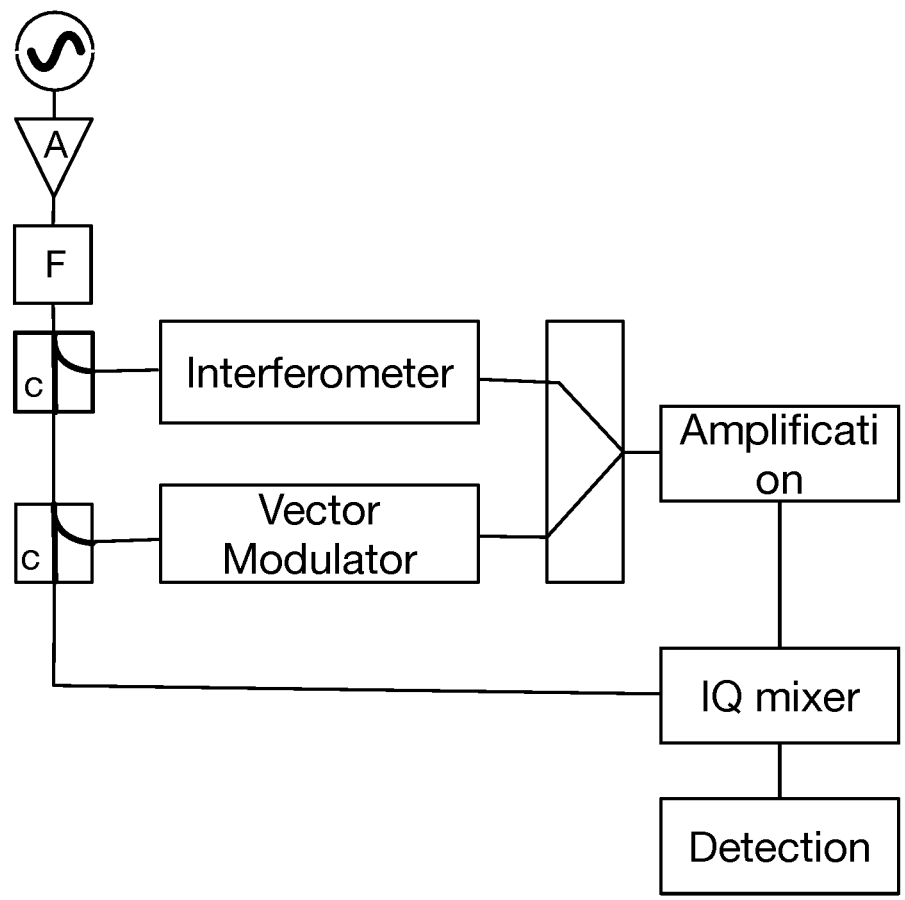
FIG. 26 is a schematic of a circuit representation of an interferometer system incorporating analog subtraction.

The aforementioned circuit components may be used in any desired fashion with the base interferometer/gradiometer components. Generally speaking, any implementation may be used as an interferometer or a gradiometer, as discussed above. In a general interferometer application first example, the base system additionally includes a vector modulator circuit, an IQ mixer circuit, an amplification circuit, and a detection circuit. FIG. 26 shows this example implemented as an interferometer. In this example, the amplification circuit amplifies the output of the "inner" interferometer and an "outer" interferometer, vector modulator circuit, which then connect to an IQ mixer circuit. All signals eventually combine and are output to the detection circuit. The general application example functions to measure fields as desired. This example may be additionally or alternatively implemented for a gradiometer system.

Figure 27:
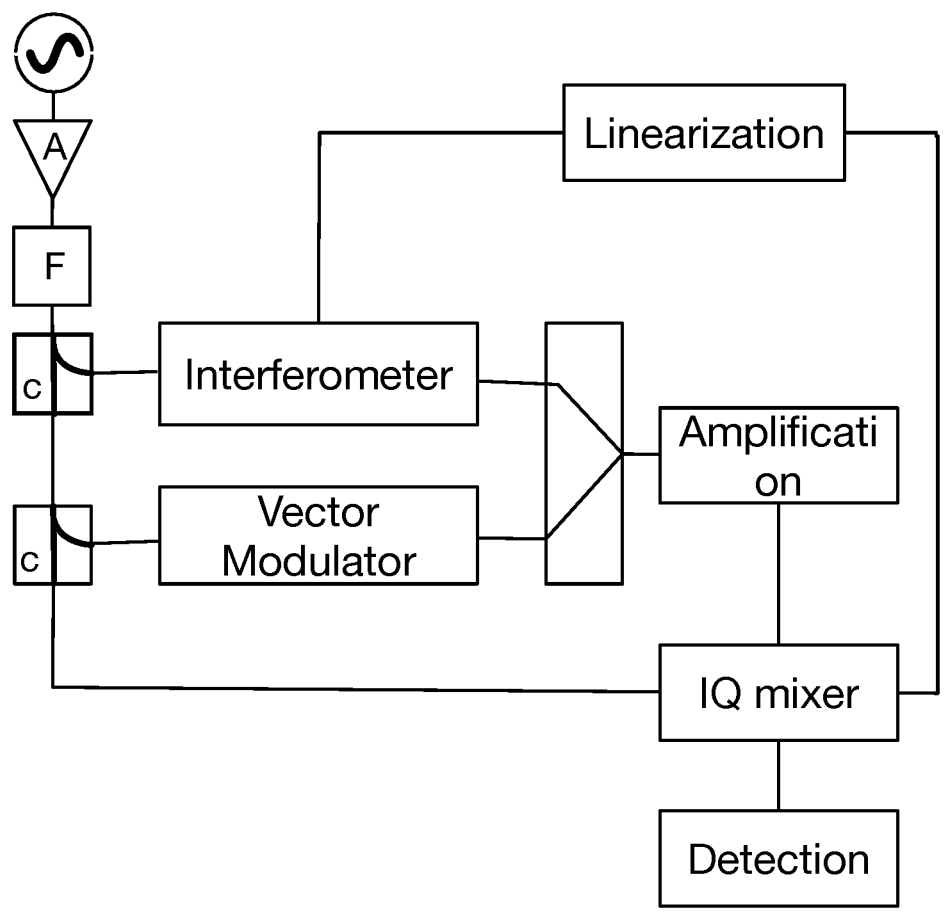
FIG. 27 is a schematic of a circuit representation of an interferometer system incorporating a linearization circuit.

In a large disparity example, that may include large disparity in field strengths, the prior general application example may additionally include the linearization circuit, as shown in FIG. 27 The large disparity example functions to precisely measure fields that may have a large disparity in magnitude. Although the general application example could function over a wide range, the large disparity example includes a feedback loop that may reduce non-linear effects due to the wide disparity of field magnitudes, thereby making field measurements more accurate.

In a low power third example, the system may include only a mixer and a detection circuit. The low power example functions in detecting fields at very low power consumption (less than 25 μW). In variations wherein the ADFMR device comprises a SAW device, the system may additionally include a matching network prior to the interferometer and after the interferometer. The matching network may provide high resistance and match the IDT impedance to the electronic oscillator and mixer impedance, thereby matching their voltages.

3. System Examples

In this section, variations of sample systems are given. Details of the described variations may be used in combination or in place of other system variations described herein. The description of these examples is not intended to limit the system to these implementations.

In a first system variation, as shown in FIG. 1, a system for an acoustically driven ferromagnetic resonance (ADFMR) based sensor includes: a power source, comprising an electronic oscillator that provides an electrical signal; an at least one circuit comprising a first ADFMR circuit that comprises an ADFMR device, wherein the first ADFMR circuit enables perturbation of the electrical signal by electromagnetic (EM) fields; and a detector circuit, that determines the EM field from the electrical signal perturbation. In many variations, the detector circuit comprises an analog to digital converter. The system functions as a sensor that may detect EM fields.

Figure 28:
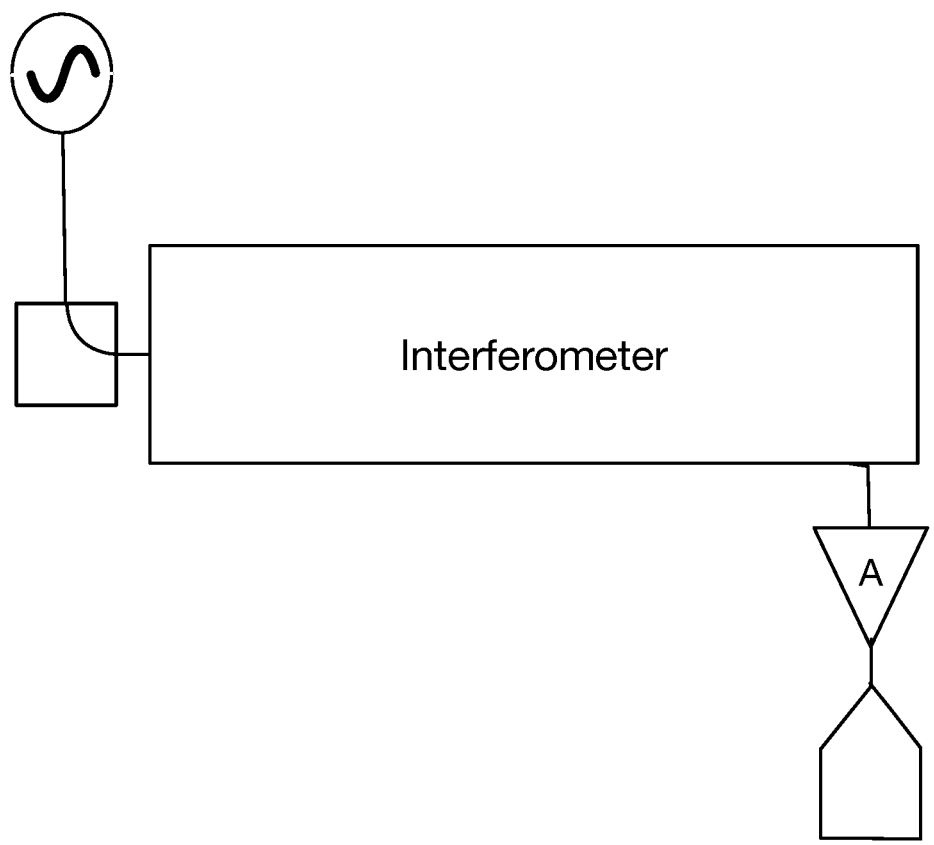
FIG. 28 is a simplified interferometer schematic.

In a first interferometer example of the first system variation, as shown in FIG. 28, the at least one circuit comprises an interferometer circuit. In some variations, the at least one circuit comprises: the aforementioned first ADFMR circuit (also referred to as first test circuit) and a first signal processing circuit that is a first reference circuit. The first reference circuit is situated parallel to the first ADFMR circuit, such that combined, the first ADFMR circuit and the first reference circuit form an interferometer circuit. The interferometer circuit functions to measure an EM field by interfering with the perturbed electrical signal through the first test circuit, with the unperturbed signal through the first reference circuit. In some variations, the interferometer circuit may comprise multiple test circuits and/or reference circuits, wherein, in conjunction, the test circuit(s) and reference circuit(s) enable EM field measurement through interference.

Figure 29:
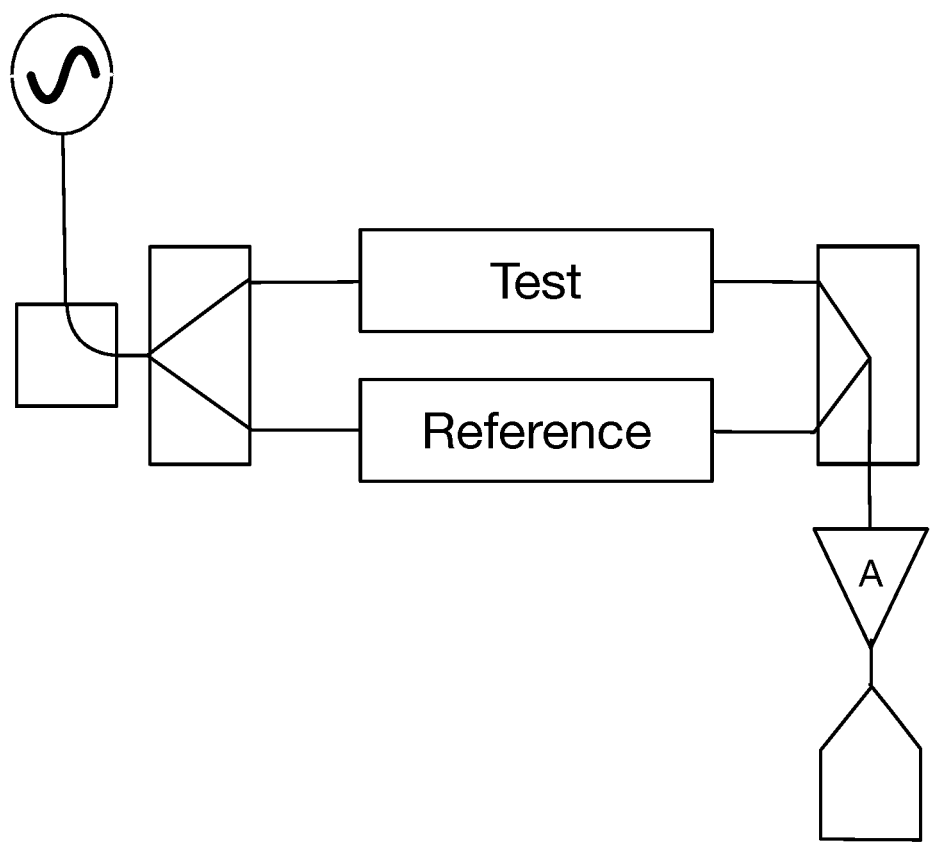
FIG. 29 is a schematic of a circuit representation of an interferometer.

In a second interferometer example of the first system variation, as shown in FIG. 29, the at least one circuit further comprises a first signal processing circuit that is a first reference circuit, situated parallel to the first ADFMR circuit. Additionally, the system further comprises a power splitter, situated upstream of the first ADFMR circuit and the first reference circuit, such that the power splitter splits the electrical signal into a test signal, that travels through the first ADFMR circuit, and a reference signal that travels through the first reference circuit; and a power combiner, situated downstream from the first ADFMR circuit and the first reference circuit, such that the power combiner combines the test signal output from the first ADFMR circuit and the reference signal output from the first reference signal. The first ADFMR circuit and the first reference circuit may function in conjunction as an interferometer circuit to measure EM fields.

Figure 4:
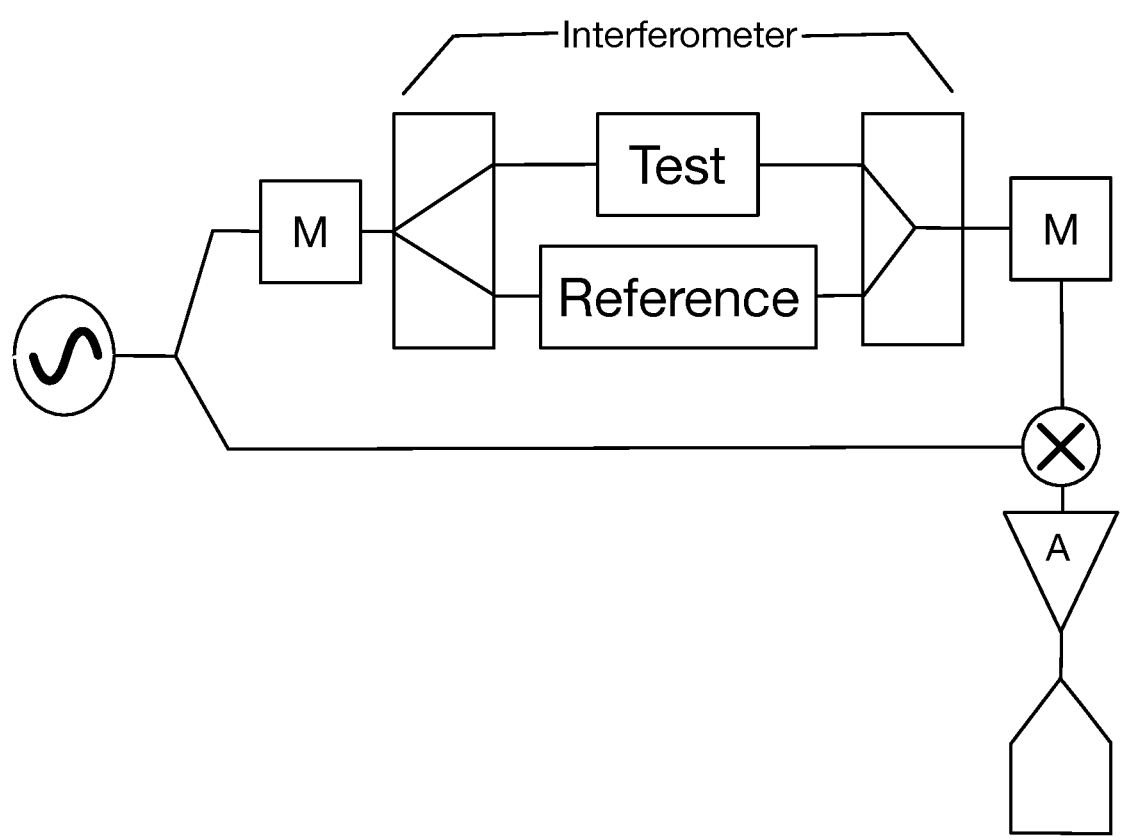
FIG. 4 is a schematic representation of a low energy interferometer system.
Figure 5:
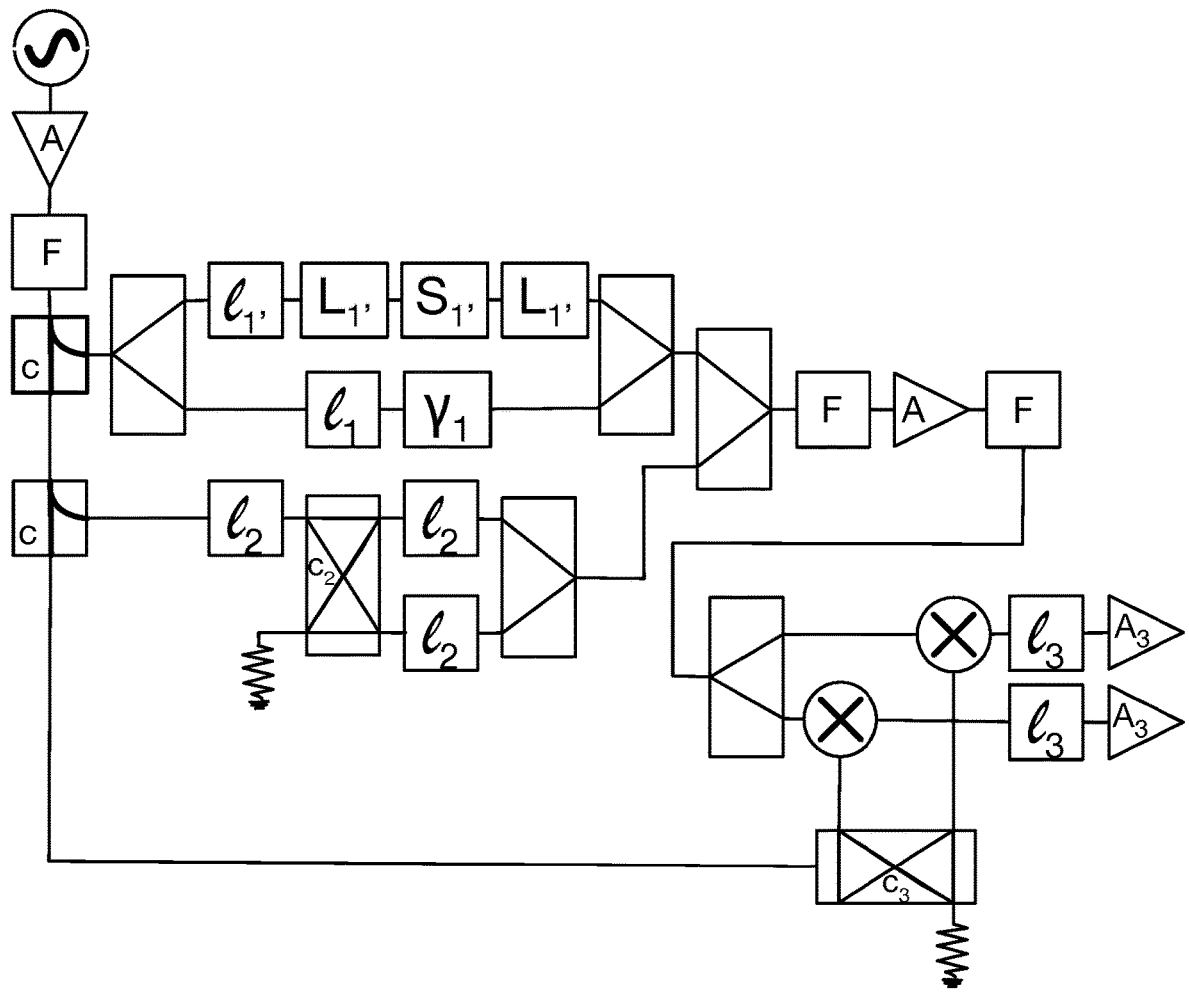
FIG. 5 is a schematic representation of an interferometer system that implements noise reduction.

The first ADFMR circuit of the interferometer variations may also have low energy/minimal examples. In a "low power" implementation, as shown in FIG. 4, the ADFMR circuit may comprise: an upstream matching network, upstream of the ADFMR device; and a downstream matching network, downstream of the ADFMR device.

Figure 30:
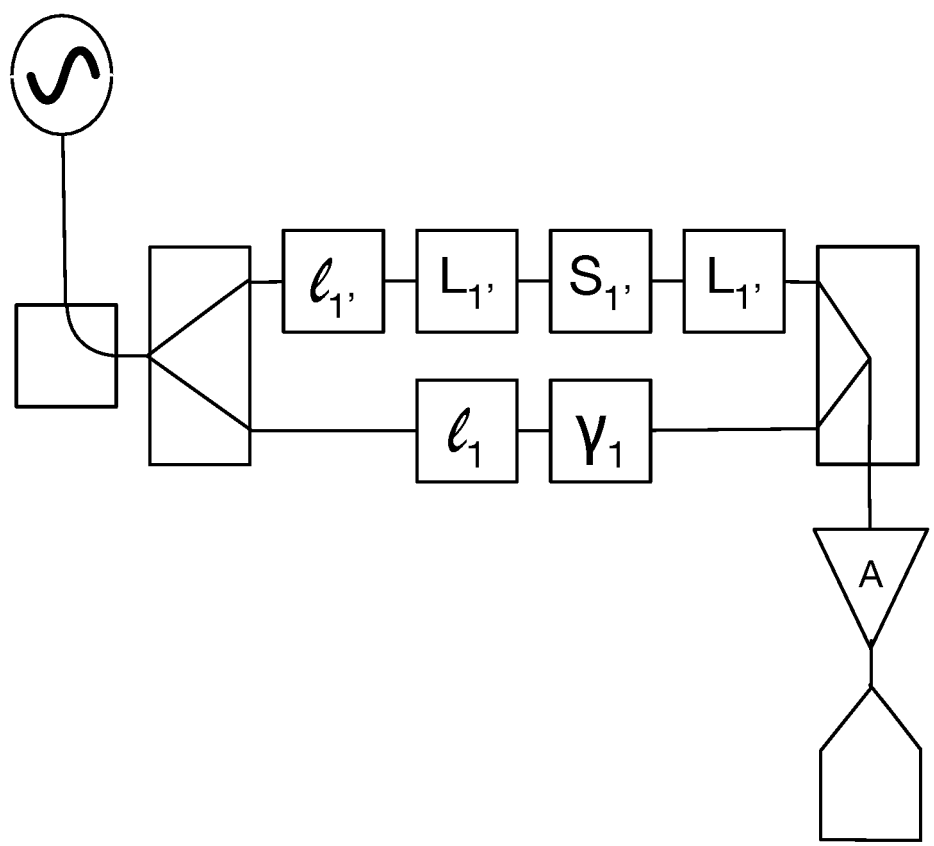
FIG. 30 is a schematic for an example interferometer including subcomponents.

In a second implementation of the interferometer circuit of the first system, as shown in one example in FIG. 30, the ADFMR circuit comprises: the aforementioned ADFMR device and an attenuator. In some variations, the attenuator may be situated upstream of the ADFMR device. Alternatively, the attenuator may be situated downstream of the ADFMR device. The ADFMR device may optionally have an upstream inductor, situated upstream of the ADFMR device, and a downstream inductor, situated downstream of the ADFMR device. The reference circuit may have many different variations. In one variation, the reference circuit comprises a phase shifter, and an attenuator. The phase shifter may function to shift the unaltered reference signal 180 degrees out of phase, such that, if combined with an unaltered test signal, the test signal and reference signal would completely destructively interfere with each other.

Figure 31:
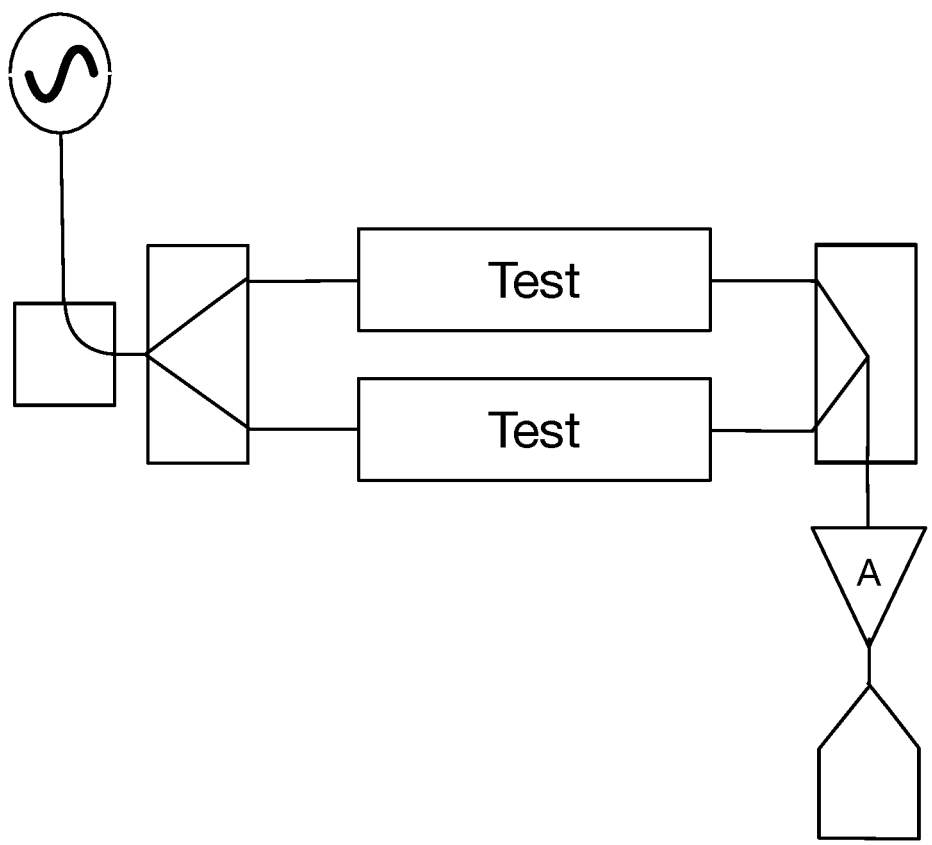
FIG. 31 is a schematic for a circuit representation of a gradiometer.

The system may also be utilized as a gradiometer. Gradiometer functionality may be an additional, or alternate, functionality of the system dependent on implementation. In a first gradiometer variation of the first system, as shown in FIG. 31, the system comprises: a power source; at least one circuit; and a detector circuit comprising an analog to digital converter. The at least one circuit preferably comprises a set of ADFMR circuits, comprising at least a first ADFMR circuit and a second ADFMR circuit, wherein the second ADFMR circuit is situated parallel to the first ADFMR circuit. Additionally, the first ADFMR circuit and the second ADFMR circuit may be spatially positioned such that the vector displacement between the two ADFMR circuits is known. The system further comprises a power splitter, situated upstream from the first test circuit and the second test circuit, such that the power splitter splits the electrical signal into two test signals: a first test signal that travels through the first ADFMR circuit, and a second test signal that travels through the second ADFMR circuit; and a power combiner, situated downstream from the first ADFMR circuit and the second ADFMR circuit, such that the power combiner combines the output first test signal from the first ADFMR circuit and the output second test signal from the second ADFMR circuit. The gradiometer variation of the system may function to measure EM field gradients by measuring the difference in the perturbation of an altered first test signal, traveling through the first ADFMR circuit, and an altered second test signal, traveling through the second ADFMR circuit. Dependent on implementation, additional test circuits may be added to the system enabling, for example full three-dimensional field gradient measurements.

In one example of the gradiometer variation of the first system, the first ADFMR circuit comprises: a first ADFMR device and a first attenuator. In some variations, the first attenuator may be situated upstream of the first ADFMR device. Alternatively, the first attenuator may be situated downstream of the first ADFMR device. Additionally, the second ADFMR circuit may comprise: a second ADFMR device and a second attenuator. In some variations, the second attenuator may be situated upstream of the second ADFMR device. Alternatively, the second attenuator may be situated downstream of the second ADFMR device. The first ADFMR device may optionally have a first upstream inductor, situated upstream of the first ADFMR device, and a first downstream inductor, situated downstream of the first ADFMR device, and the second ADFMR device may optionally have a second upstream inductor, situated upstream of the second ADFMR device, and a second downstream inductor, situated downstream of the second ADFMR device.

The ADFMR device of all variations may have different forms. In some variations, the ADFMR device comprises a surface acoustic wave (SAW) device. Particularly both in interferometer variations, and the gradiometer variations, the ADFMR device may comprise a SAW device. The SAW device functions to generate and utilize SAWs to achieve ferromagnetic resonance, and thereby measure EM fields (and EM field gradients) through the SAW waves. Dependent on implementation, other types of ADFMR devices may be used. Other examples include F-bar and BAW devices.

As the SAW is altered due to the magnetostrictive properties of an embedded ferromagnet in the SAW device, in many variations one SAW device is typically sensitive to EM fields of a single orientation (e.g., can measure fields in the "x-direction"). Dependent on desired implementation, either more complex (e.g., FIGS. 14-18) SAW devices may be implemented, or multiple SAW devices may be implemented for multi-dimensional field and field gradient measurements. In one three-dimensional interferometer implementation, the system may comprise three ADFMR test circuits, wherein each test circuit comprises an ADFMR device situated in an orthogonal direction. In one three-dimensional gradiometer implementation, the system may comprise twelve ADFMR test circuits, wherein each set of four test circuits will have an ADFMR device with the same orientation, and wherein each set of four test circuits would define positionally span three-dimensional space (e.g., measure the x-direction gradient of an EM field in the x, y, and z directions).

In some variations the system may be implemented for multidimensional functionality. Multidimensional functionality may be implemented with any variation of the system, including interferometry and gradiometry implementations. In one multidimensional implementation, as shown in FIG. 9, the ADFMR device of the first ADFMR circuit comprises a first ADFMR device, and the at least one circuit comprises a second ADFMR circuit that includes a second ADFMR device, wherein the second ADFMR device has a distinct sensing orientation as compared to the first ADFMR device. In this two-dimensional implementation, the system may have two-dimensional functionality to measure EM fields in a plane.

In another multidimensional implementation, multidimensional sensing may be set up in series. In this implementation, as shown in FIG. 1*i*, the first ADFMR circuit may include two ADFMR devices, wherein each ADFMR device has a distinct sensing orientation.

In some variations the system may be implemented with noise reduction/and or cancellation capabilities. Noise reduction functionality may be implemented with any variation of the system, including interferometry and gradiometry implementations. In one noise reduction interferometer variation, as shown in FIG. 32, an interferometer system may further include a vector modulator circuit situated parallel to the first ADFMR circuit, acting as an "outer" interferometer. Dependent on implementation, the vector modulator circuit may function as analog subtraction circuitry to reduce ambient noise, and/or 1/f noise.

Figure 33:
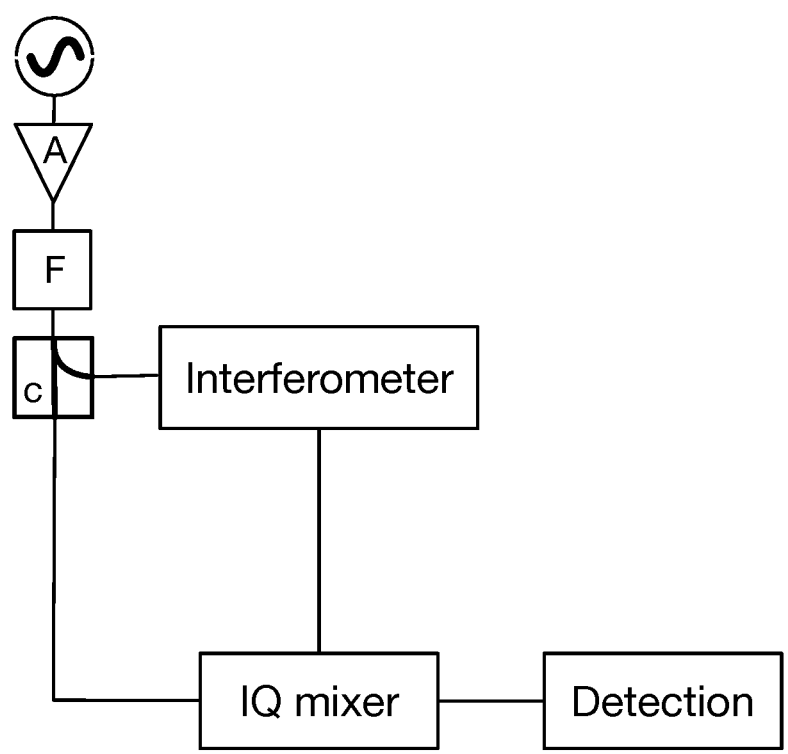
FIG. 33 is a schematic for a circuit representation of an interferometer with an IQ mixer circuit.

In some variations, the system may be implemented with an IQ mixer circuit. The IQ mixer circuit may improve signal measurement by separating the perturbed electrical signal into a linear combination of orthogonal waves. The IQ mixer may be implemented in any system variation, including interferometry and gradiometry implementations. In one IQ mixer interferometer variation, as shown in FIG. 33, the interferometer system further includes an IQ mixer circuit, wherein the IQ mixer is situated upstream of the detector circuit such that it receives the electrical signal output of the interferometer circuit and another electrical signal input. In some implementations, the another signal input comprises an input from the original electrical signal. Dependent on desired implementation, the original electrical signal to the IQ-mixer may be unaltered or modified (e.g., with the inclusion of an amplifier circuit between the power source and the IQ-mixer.

Figure 34:
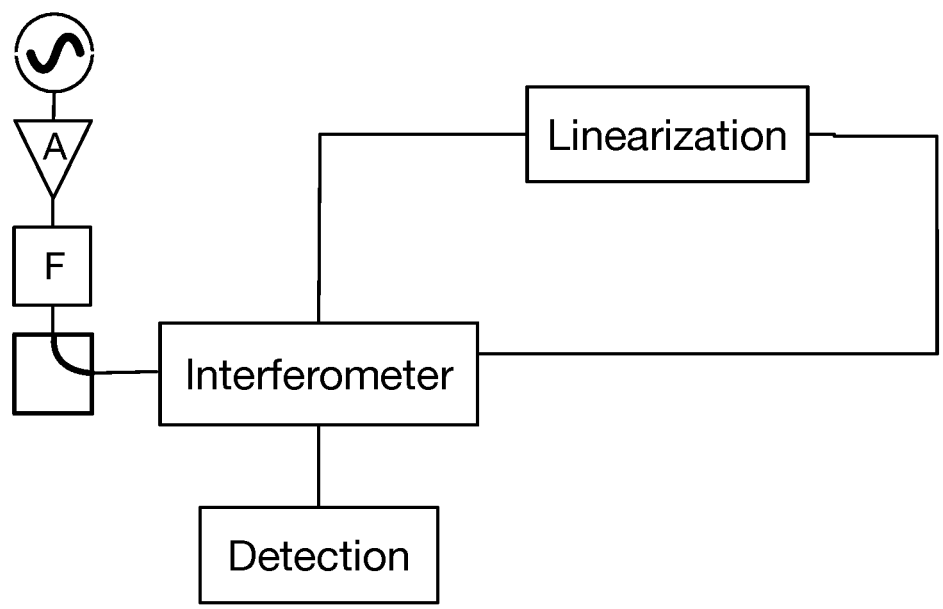
FIG. 34 is a schematic for a circuit representation of an interferometer with a linearization circuit.

The system may be modified, such that an applied external EM field is measured in desired field magnitude bandwidth, such that ADFMR device functions optimally, or near optimally. In these variations, the system may be implemented with a linearization circuit. The linearization circuit may enable normalization of the external EM field to the desired field magnitude bandwidth. The linearization may be implemented in any system variation, including interferometry and gradiometry implementations. In one interferometry system implementation of the linearization circuit, as shown in FIG. 34, the system further comprises a linearization circuit, wherein the linearization circuit comprises an EM field source, directed at the first ADFMR circuit, a comparator, and a logic circuit. The linearization circuit may be configured to operate in a setup mode, such that the EM field source modifies the applied EM field on the first ADFMR circuit, such that the applied EM field is within an improved measuring regime. The setup mode may thus enable incremental improvement of the measuring regime, and may thus incrementally bring the system to an optimal, or near optimal, measuring regime.

3. Method

As shown in FIG. 35, a method for EM field measurement using an acoustically driven ferromagnetic (ADFMR) sensor comprises: at an oscillator, generating an electrical signal S110; at a ADFMR sensor, converting the electrical signal to an acoustic wave S120; at the ADFMR sensor, propagating the acoustic wave across a magnetic material S130, thereby altering the acoustic wave in proportion to the EM field affecting the magnetic material; and at the ADFMR sensor, converting the altered acoustic wave to an altered electrical signal S140; and measuring the EM field S150, using the altered acoustic wave.

The method functions to leverage the sensitivity of ferromagnetics, at or near resonance, to EM fields to measure EM fields. In preferred variations, the method may include additional steps to optimize field measurement These additional steps may include: reducing the signal bandwidth; reducing signal noise, and optimizing field absorption. The method may additionally and/or alternatively include other steps to improve field measurement. The method is preferably used with the system as described above, but may be implemented with any desired applicable system. The method may be particularly useful in enabling implementation of an ADFMR sensor as an interferometer, such that the altered electrical signal is recombined with an unaltered reference signal, to measure the EM field. The method may also be particularly useful in enabling implementation of an ADFMR sensor as a gradiometer, such that multiple field measurements of space may be used to determine the change of the EM field.

In some variations, the method may be implemented to enable interferometer functionality. In these variations, the method may further include: prior to the ADFMR sensor, splitting the electrical signal into a test and reference electrical signal; after the ADFMR sensor, combining the altered electrical signal with the reference electrical signal; using the reference signal to determine the EM field strength.

In some variations, the method may be implemented to enable gradiometer functionality. In these variations, the method may further include: prior to the ADFMR sensor, splitting the electrical signal into multiple test signals.

Block S110, which includes generating an electrical signal, functions to provide power for the ADFMR functionality. Generating an electrical signal S110 may generate either a direct current (DC) or an alternating current (AC). In some variations, the electrical signal is AC and generating the electrical signal S110 occurs at a voltage oscillator. In some variations the AC may be on the order of MHz-GHz. Alternatively, the AC frequency may be higher or lower. In preferred variations, the AC frequency is on the order such that the electrical signal is complementary with an acoustic transducer, such that all, or part, of the electrical signal may be converted into an acoustic wave.

In many variations, the method may include splitting the electrical signal. Splitting the electrical signal, functions to take a single current (e.g., AC or DC) and split it into two currents. In interferometer variations, these currents may comprise: a test signal, to the ADFMR sensor, and a reference signal. Splitting the current may enable comparison measurement between the test signal and the reference signal as part of an interferometer variation. For a gradiometer implementation, the splitting the signal may split the electrical signal into two test signals (e.g., a first test signal and a second test signal) sent to distinct ADFMR sensors. Dependent on implementation, all method steps that refer or apply to the test signal, or ADFMR sensor, will equally refer, or apply, to all ADFMR sensors and/or all test signals.

In addition to interferometer and gradiometer variations, splitting the electrical signal may be implemented in many variations for enhanced or improved functionality in measuring EM fields. Splitting the electrical signal may occur, zero, once, or multiple times, dependent on the implementation. For example, splitting the electrical signal may be implemented in conjunction with specific circuits and components to: amplify desired signals, make multidimensional field measurements, filter noise (e.g., reduce i/f noise), optimize field detection (e.g., through field normalization), and/or improve field measurement. In variations that include splitting the electrical signal, the method may further include a complementary step to combine electrical signals into a single signal.

Block S120, which includes converting the electrical signal to an acoustic wave S120, functions to convert the part, the entire, electrical signal into an acoustic wave. Converting the electrical signal preferably occurs at the ADFMR sensor. More precisely, the block S120 occurs at an acoustic transducer at, or on, the ADFMR sensor, wherein the electrical signal is absorbed to generate an acoustic wave of the desired type, frequency, and amplitude.

The generated acoustic wave may be of any desired type, as long as it is functional with the ADFMR sensor. Examples of possibly generated acoustic waves include: surface acoustic waves (SAWs), bulk acoustic waves (BAWs), Fbars, lamb-waves, or any other types of acoustic waves. In preferred variations, the acoustic wave frequency and amplitude are proportional to the converted electrical signal. That is a relatively larger electrical signal may generate a relatively larger acoustic wave, and/or a relatively higher frequency electrical signal may generate a relatively higher frequency acoustic wave.

In some variations, converting the electrical signal to an acoustic wave S120, comprises generating a SAW from the electrical signal. In these variations, the ADFMR sensor may comprise a SAW device. In these variations, generating the SAW may comprise generating a SAW from the electrical signal using the piezoelectric. In preferred variations, the electrical signal is converted to a radio frequency (RF) field that is then converted to a SAW by an input interdigitated transducer (IDT), but other methods may be implemented. In this variation the input IDT is preferably a component of the SAW device, which additionally includes a piezoelectric substrate base, an output IDT, and a ferromagnetic material along the piezoelectric substrate between the input IDT and output IDT. Generating a SAW preferably generates a SAW with a frequency at, or close to, the resonance frequency of the ferromagnetic material.

Block S130, which includes propagating the acoustic wave across a magnetic material on an ADFMR sensor, enables a perturbation of the acoustic wave in proportion to the effect of the EM field on the magnetic material. The external EM field may bias the magnetic material, thereby altering the acoustic wave in proportion to the EM field magnitude. In SAW device variations, As the SAW travels propagates along the ferromagnet, the ferromagnet may become excited to resonance. This may cause the ferromagnet to absorb a portion of the incident acoustic wave. Near resonance, the amount of acoustic power absorbed will vary strongly with the external magnetic field. In some variations, the ferromagnet may be magnetostrictive, such that the propagating acoustic wave generates an effective RF magnetic field (at the frequency of the acoustic wave or an integer a multiple thereof) within the ferromagnet. In other variations, the ferromagnet may have other properties that enable perturbation of the propagating acoustic wave. Perturbation of the acoustic wave may be of any desired type, with the limiting factor that the perturbation is proportional to the magnitude and direction of the EM field. In this manner, block S130 may include sensing an external EM field through the altered acoustic wave.

Block S140, which includes converting the altered acoustic wave to an altered electrical signal, enables measuring the field using the altered electrical signal. Converting the altered acoustic wave into an altered electrical signal may occur at the ADFMR sensor, preferably at an acoustic transducer. In variations wherein the ADFMR sensor comprises a SAW device, the acoustic transducer may comprise the output IDT. Thus, converting the altered acoustic wave to an altered electrical signal S140 may occur at an output IDT on the piezoelectric substrate of the SAW device. In similar fashion to the altered acoustic wave, the altered electrical signal thus includes information regarding the external EM field.

Block S150, which includes measuring the field, functions in determining the EM field strength at a detector. This is preferably accomplished by combining the altered electrical signal with a reference signal and utilizing interference (e.g., destructive interference) to determine the field strength. In some variations that utilize destructive interference, measuring the field S150 may include phase shifting the reference field half a period such that the reference signal and the original electrical signal cancel each other out. In the alternative preferred variation for measuring the field gradient, measuring the field S150 includes determining the difference in the field strength between altered electrical signals (e.g., determining the difference between a first and a second altered test signal).

Measuring the field S150 may include converting the signal to a digital signal. Converting the signal to a test signal may have two variations: Test signals and reference signals may be first combined and then digitized, or they may be digitized separately and then combined together. That is, measuring the field S150 may include: combining an altered electrical signal and a reference signal, and then converting the combined signal to a digital output signal; or converting the altered electrical signal to a digital altered electrical signal, converting the reference signal to a digital reference signal, and then combining the digital test signal and the digital reference signal.

Highly sensitive measurements, noise and other environmental issues may play a factor in hindering the accuracy of field measurements made using this method. The method may include additional steps to improve field measurement. In addition to other potential improvement steps, the method may include: reducing the signal bandwidth; reducing signal noise, and optimizing field absorption.

Reducing the signal bandwidth functions to create a thin coherent signal band instead of a large signal spectrum. Reducing the signal bandwidth preferably occurs at a bandpass filter, but other filters may be additionally or alternatively used. Reducing the signal bandwidth may reduce signal noise. Additionally, reducing signal bandwidth may improve the size and space of acoustic wave packets to minimize interference between distinct acoustic wave packets.

Reducing signal noise functions to reduce system noise that may affect field measurement. 1/f (i.e., pink noise) may particularly be a major factor inhibiting precise field measurement. Reducing signal noise may include lowering the power of the signal and filtering the signal to reduce noise. Reducing signal noise may comprise passing the electrical signal through attenuators. Digital attenuators may be implemented to remove all activity below some threshold. Analog attenuators may also be implemented to lower the power and minimize noise. 1/f noise may also be minimized by using an interferometer or bias coil to minimize the signal power input to any amplifiers or other active components.

In some variations, the method may include optimizing field absorption. Optimizing field absorption functions to improve the field absorption by the ferromagnet. The ferromagnet may have an optimal field strength at which absorption amplitude is most sensitive to external field. Optimizing the field absorption may include modifying the applied field strength to improve field measurement. In one example, optimizing the field absorption may include determining an optimal field absorption strength range, and applying a field to the ADFMR sensor such that the total applied field is on, or near, the optimal field absorption strength range.

4. System Architecture

The systems and methods of the embodiments can be embodied and/or implemented at least in part in connection with a computing system including at least one a machine configured to receive a computer-readable medium storing computer-readable instructions. The ADFMR device enabled system and method above can be integrated within a computing system such that programmatic control of such a device may be used, wherein the computing system can make use of a sensor input providing EM field sensor data. The computing system can include one or more ADFMR enabled systems. The instructions can be executed by computer-executable components integrated with the application, applet, host, server, network, website, communication service, communication interface, hardware/firmware/software elements of a user computer or mobile device, wristband, smartphone, or any suitable combination thereof.

Other systems and methods of the embodiment can be embodied and/or implemented at least in part as a machine configured to receive a computer-readable medium storing computer-readable instructions. The instructions can be executed by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

In one variation, a system comprising of one or more computer-readable mediums storing instructions that, when executed by the one or more computer processors, cause a computing platform to perform operations comprising those of the system or method described herein such as: generating an electrical signal; converting the electrical signal to an acoustic wave; propagating the acoustic wave across a magnetic material; converting the altered acoustic wave to an altered electrical signal; and measuring the field.

In one variation, a non-transitory computer-readable medium storing instructions that, when executed by one or more computer processors of a computing platform, can cause the computing platform to perform operations of the system or method described herein such as: generating an electrical signal; converting the electrical signal to an acoustic wave; propagating the acoustic wave across a magnetic material; converting the altered acoustic wave to an altered electrical signal; and measuring the field.

Figure 36:
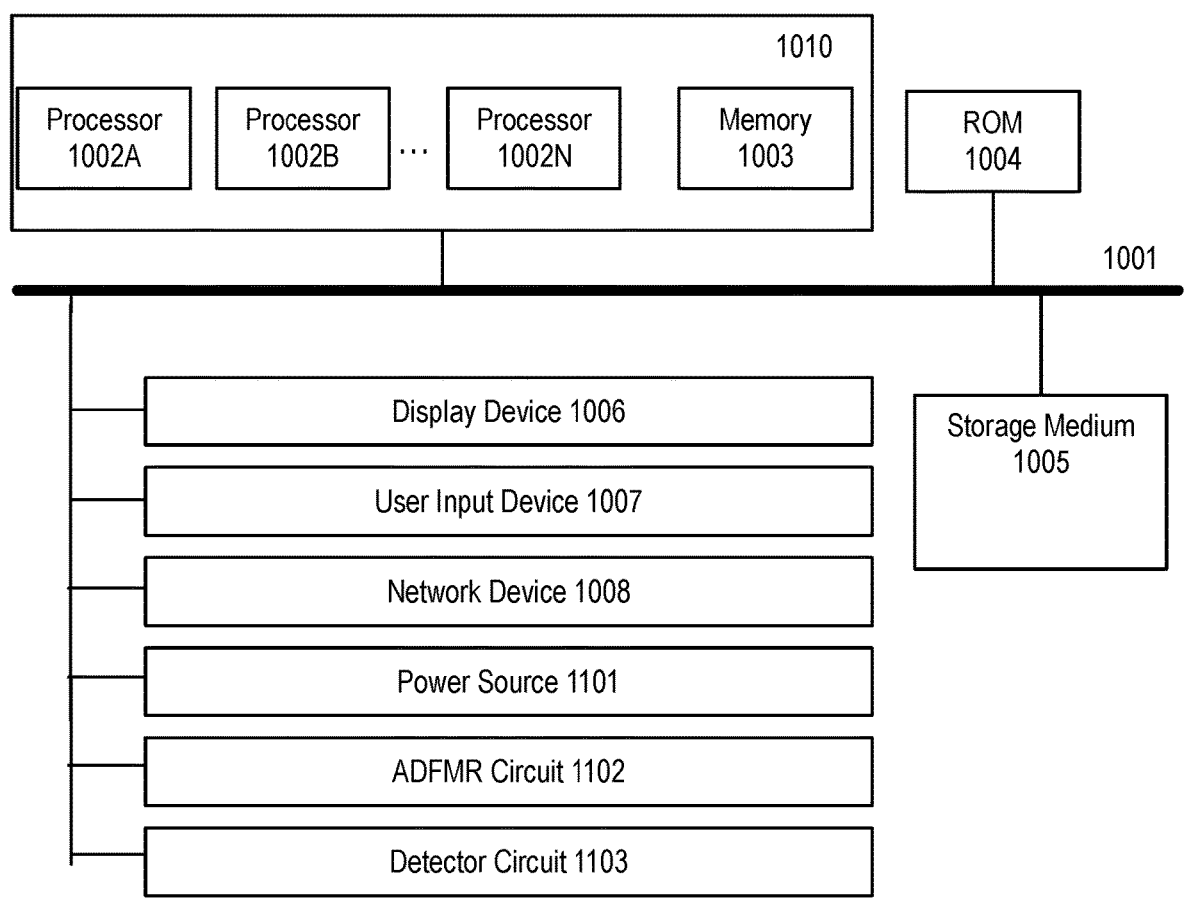
FIG. 36 is an exemplary system architecture that may be used in implementing the system and/or method.
Figure 38:
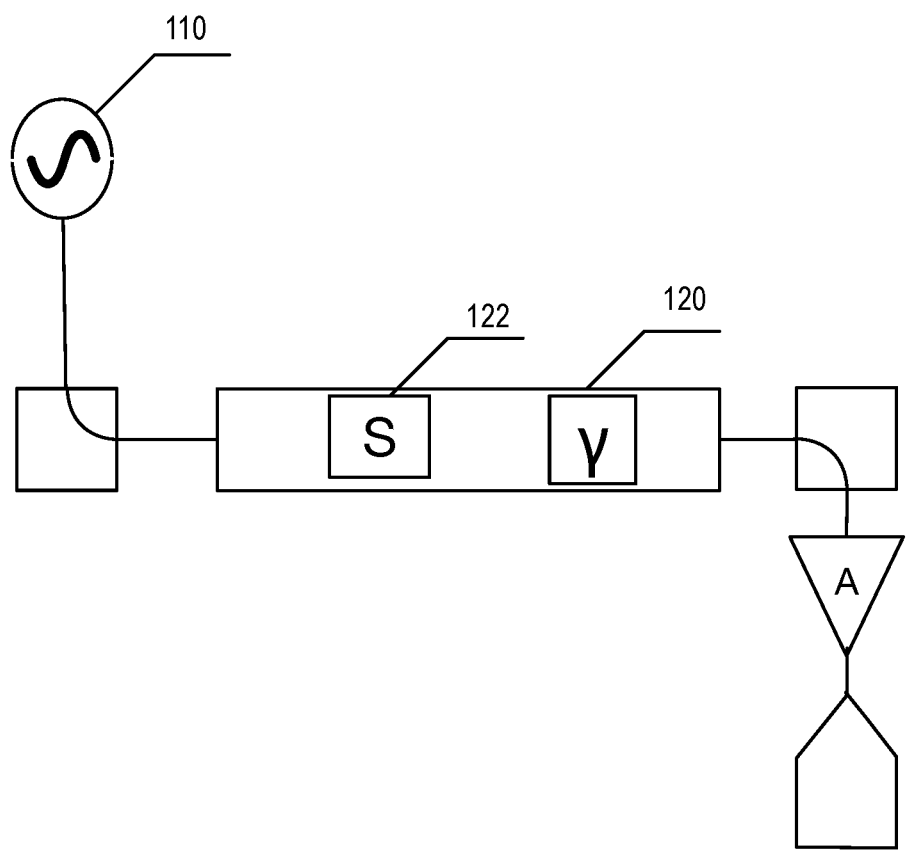

FIG. 36 is an exemplary computer architecture diagram of one implementation of the system. In some implementations, the system is implemented in a plurality of devices in communication over a communication channel and/or network. In some implementations, the elements of the system are implemented in separate computing devices. In some implementations, two or more of the system elements are implemented in same devices. The system and portions of the system may be integrated into a computing device or system that can serve as or within the system.

The communication channel 1001 interfaces with the processors 1002A-1002N, the memory (e.g., a random access memory (RAM)) 1003, a read only memory (ROM) 1004, a processor-readable storage medium 1005, a display device 1006, a user input device 1007, and a network device 1008. As shown, the computer infrastructure may be used in connecting a power source 1101, and ADFMR circuit 1102, a detector circuit 1103, and/or other suitable computing devices. Alternatively, the system described above may be enabled as a self-contained system that is connected to the computer infrastructure.

The processors 1002A-1002N may take many forms, such CPUs (Central Processing Units), GPUs (Graphical Processing Units), microprocessors, ML/DL (Machine Learning/Deep Learning) processing units such as a Tensor Processing Unit, FPGA (Field Programmable Gate Arrays, custom processors, and/or any suitable type of processor.

The processors 1002A-1002N and the main memory 1003 (or some sub-combination) can form a processing unit 1010. In some embodiments, the processing unit includes one or more processors communicatively coupled to one or more of a RAM, ROM, and machine-readable storage medium; the one or more processors of the processing unit receive instructions stored by the one or more of a RAM, ROM, and machine-readable storage medium via a bus; and the one or more processors execute the received instructions. In some embodiments, the processing unit is an ASIC (Application-Specific Integrated Circuit). In some embodiments, the processing unit is a SoC (System-on-Chip). In some embodiments, the processing unit includes one or more of the elements of the system.

A network device 1008 may provide one or more wired or wireless interfaces for exchanging data and commands between the system and/or other devices, such as devices of external systems. Such wired and wireless interfaces include, for example, a universal serial bus (USB) interface, Bluetooth interface, Wi-Fi interface, Ethernet interface, near field communication (NFC) interface, and the like.

Computer and/or Machine-readable executable instructions comprising of configuration for software programs (such as an operating system, application programs, and device drivers) can be stored in the memory 1003 from the processor-readable storage medium 1005, the ROM 1004 or any other data storage system.

When executed by one or more computer processors, the respective machine-executable instructions may be accessed by at least one of processors 1002A-1002N (of a processing unit 1010) via the communication channel 1001, and then executed by at least one of processors 1001A-1001N. Data, databases, data records or other stored forms data created or used by the software programs can also be stored in the memory 1003, and such data is accessed by at least one of processors 1002A-1002N during execution of the machine-executable instructions of the software programs.

The processor-readable storage medium 1005 is one of (or a combination of two or more of) a hard drive, a flash drive, a DVD, a CD, an optical disk, a floppy disk, a flash storage, a solid state drive, a ROM, an EEPROM, an electronic circuit, a semiconductor memory device, and the like. The processor-readable storage medium 1005 can include an operating system, software programs, device drivers, and/or other suitable sub-systems or software.

As used herein, first, second, third, etc. are used to characterize and distinguish various elements, components, regions, layers and/or sections. These elements, components, regions, layers and/or sections should not be limited by these terms. Use of numerical terms may be used to distinguish one element, component, region, layer and/or section from another element, component, region, layer and/or section. Use of such numerical terms does not imply a sequence or order unless clearly indicated by the context. Such numerical references may be used interchangeable without departing from the teaching of the embodiments and variations herein.

As a person skilled in the art will recognize from the previous detailed description and from the figures and claims, modifications and changes can be made to the embodiments of the invention without departing from the scope of this invention as defined in the following claims.

We claim:
1. A system for an acoustically driven ferromagnetic resonance (ADFMR) based sensor includes:
   a power source, comprising an electronic oscillator that provides an electrical signal;
   an at least one circuit coupled to the power source to receive the electrical signal, the at least one circuit comprising a set of ADFMR circuits comprising:
   a first ADFMR circuit, wherein the first ADFMR circuit comprises a first ADFMR device, wherein the first ADFMR circuit enables perturbation of the electrical signal by electromagnetic (EM) fields external to the system;

a second ADFMR circuit connected in parallel to the first ADFMR circuit; and a power splitter upstream from the first and second ADFMR circuits and configured to split the electrical signal into a first test signal that travels through the first ADFMR circuit and a second test signal that travels through the second ADFMR circuit;

a power combiner downstream of the first and second ADFMR circuits and configured to combine an output of the first ADFMR circuit and the second ADFMR circuit; and a detector circuit, that determines the EM field from the electrical signal perturbation.

2. The system of claim 1, wherein the at least one circuit comprises an interferometer circuit.

3. The system of claim 2, wherein the at least one circuit further comprises a first signal processing circuit that is a first reference circuit, wherein the first reference circuit is situated parallel to the first ADFMR circuit such that combined, the first ADFMR circuit and the first reference circuit form the interferometer circuit.

4. The system of claim 1, wherein the at least one circuit further comprises:
a first signal processing circuit, that is a first reference circuit situated parallel to the first ADFMR circuit and;
wherein the power splitter is configured to split the electrical signal into:
the first test signal, the second test signal, and
a reference signal, that travels through the first reference circuit; and
wherein the power combiner is configured to combine the first test signal output from the first ADFMR circuit, the second test signal output from the second ADFMR circuit, and the reference signal output from the first reference circuit.

5. The system of claim 4, wherein the first ADFMR circuit further comprises:
an upstream matching network, upstream of the first ADFMR device; and
a downstream matching network, downstream of the first ADFMR device.

6. The system of claim 4, wherein the first ADFMR circuit further comprises an attenuator.

7. The system of claim 6, wherein the first ADFMR circuit further comprises a phase shifter.

8. The system of claim 7, wherein the first ADFMR device comprises a surface acoustic wave device.

9. The system of claim 1, wherein the first ADFMR circuit comprises: the first ADFMR device and a first attenuator.

10. The system of claim 9, wherein the second ADFMR circuit comprises: a second ADFMR device and a second attenuator.

11. The system of claim 10, wherein the first ADFMR device comprises a first surface acoustic wave device, and the second ADFMR device comprises a second surface acoustic wave device.

12. The system of claim 1,
wherein
the second ADFMR circuit that includes a second ADFMR device;
wherein the second ADFMR device has a distinct sensing orientation as compared to the first ADFMR device.

13. The system of claim 1, wherein the first ADFMR circuit includes the first ADFMR device and one or more additional ADFMR devices, wherein each ADFMR device of the first ADFMR circuit has a distinct sensing orientation.

14. The system of claim 3, wherein the at least one circuit further comprises a vector modulator circuit that is situated parallel to the first ADFMR circuit.

15. The system of claim 3,
wherein the at least one circuit further comprises an IQ mixer circuit,
wherein the IQ mixer is situated upstream of the detector circuit such that it receives the electrical signal output of the interferometer circuit and another electrical signal input.

16. The system of claim 15, wherein the another electrical signal input comprises input from the original electrical signal.

17. The system of claim 3, wherein the at least one circuit further comprises a linearization circuit, wherein the linearization circuit comprises an EM field source, directed at the first ADFMR circuit, a comparator, and a logic circuit.

18. The system of claim 17, wherein the linearization circuit is configured to operate in a setup mode, such that the EM field source modifies the applied EM field on the first ADFMR circuit such that the applied EM field is within a desired measuring regime.

* * * * *